US008399095B2

(12) United States Patent
Pesek et al.

(10) Patent No.: US 8,399,095 B2
(45) Date of Patent: *Mar. 19, 2013

(54) SOLAR CELLS MODULES COMPRISING LOW HAZE ENCAPSULANTS

(75) Inventors: Steven C. Pesek, Orange, TX (US); Charles Anthony Smith, Vienna, WV (US); W Alexander Shaffer, Orange, TX (US); Richard Allen Hayes, Beaumont, TX (US)

(73) Assignee: E I du Pont de Nemours and Company, Wilmington, DE (US)

( * ) Notice: Subject to any disclaimer, the term of this patent is extended or adjusted under 35 U.S.C. 154(b) by 396 days.

This patent is subject to a terminal disclaimer.

(21) Appl. No.: 12/610,431

(22) Filed: Nov. 2, 2009

(65) Prior Publication Data

US 2010/0108126 A1  May 6, 2010

Related U.S. Application Data

(60) Provisional application No. 61/110,486, filed on Oct. 31, 2008, provisional application No. 61/141,440, filed on Dec. 30, 2008.

(51) Int. Cl.
| | |
|---|---|
| *B32B 17/10* | (2006.01) |
| *B32B 27/32* | (2006.01) |
| *B32B 27/36* | (2006.01) |
| *B32B 15/08* | (2006.01) |
| *H01L 31/048* | (2006.01) |
| *H01L 31/042* | (2006.01) |
| *H01L 21/56* | (2006.01) |
| *C08F 8/00* | (2006.01) |
| *C08F 20/06* | (2006.01) |

(52) U.S. Cl. ........ 428/412; 428/441; 428/461; 428/523; 428/339; 428/500; 136/251; 136/244; 136/259; 136/252; 524/556; 526/317.1

(58) Field of Classification Search .................. 428/412, 428/441, 461, 523, 339, 500; 136/251, 244, 136/259, 252; 524/556; 526/317.1
See application file for complete search history.

(56) References Cited

U.S. PATENT DOCUMENTS

| | | |
|---|---|---|
| 2,632,921 A | 3/1953 | Kreidl |
| 2,648,097 A | 8/1953 | Kritchever |
| 2,683,894 A | 7/1954 | Kritchever |
| 2,704,382 A | 3/1955 | Kriedl |
| 2,897,183 A | 7/1959 | Christl et al. |
| 3,234,062 A | 2/1966 | Morris |
| 3,311,517 A | 3/1967 | Keslar et al. |
| 3,404,134 A | 10/1968 | Rees |
| 3,852,136 A | 12/1974 | Plumat et al. |
| 4,035,549 A | 7/1977 | Kennar |
| 4,248,990 A | 2/1981 | Pieski et al. |
| 4,341,576 A | 7/1982 | Lewis |
| 4,385,951 A | 5/1983 | Pressau |
| 4,398,979 A | 8/1983 | Cathers et al. |
| 4,599,392 A | 7/1986 | McKinney et al. |
| 4,615,989 A | 10/1986 | Ritze |
| 4,732,814 A | 3/1988 | Hatada et al. |
| 4,865,711 A | 9/1989 | Kittler |
| 5,028,674 A | 7/1991 | Hatch et al. |
| 5,173,212 A | 12/1992 | Speit et al. |
| 5,264,286 A | 11/1993 | Ando et al. |
| 5,411,845 A | 5/1995 | Robinson |
| 5,415,909 A | 5/1995 | Shohi et al. |
| 5,415,942 A | 5/1995 | Anderson |
| 5,476,553 A | 12/1995 | Hanoka et al. |
| 5,478,402 A | 12/1995 | Hanoka |
| 5,507,881 A | 4/1996 | Sichanugrist et al. |
| 5,512,107 A | 4/1996 | Van Den Berg |
| 5,536,347 A | 7/1996 | Moran |
| 5,580,927 A | 12/1996 | Chou et al. |
| 5,583,057 A | 12/1996 | Inoue |
| 5,587,430 A | 12/1996 | Talkowski |
| 5,690,994 A | 11/1997 | Robinson |
| 5,698,329 A | 12/1997 | Robinson |
| 5,733,382 A | 3/1998 | Hanoka |

(Continued)

FOREIGN PATENT DOCUMENTS

| | | |
|---|---|---|
| EP | 0769818 A2 | 4/1997 |
| EP | 1182710 A1 | 2/2002 |

(Continued)

OTHER PUBLICATIONS

Hasch et al., High-Pressure Phase Behavior of Mixtures of Poly (Ethylene-Co-Methyl Acrylate) With Low Molecular Weight Hydrocarbons, Journal of Polymer Science: Part B: Polymer Physics, 1992, 1365-1373, vol. 30.
Longworth, Thermoplastic Ionic Polymers: Ionomers, 1975, 69-171, Chapter 2, Halstead, New York.
Morris, The Stiffness of Ionomers: How It Is Achieved and Its Importance to Flexible Packaging Application, ANTEC, 2003, 3157-3161, vol. 3, Wilmington, Delaware.
PCT International Search Report and Written Opinion for International application No. PCT/US2009/062919 dated Feb. 23, 2010.
PCT International Preliminary Report on Patentability for International application No. PCT/US2009/062919 dated May 12, 2011.

(Continued)

*Primary Examiner* — Michael M Bernshteyn
(74) *Attorney, Agent, or Firm* — Maria M. Kourtakis; Kelly Law Registry; Tong T. Li (57) ABSTRACT

A solar cell module comprises a solar cell layer and an ionomer sheet. The ionomer sheet comprises a first ionomer that is the neutralized product of a first precursor acid copolymer, which, in turn, comprises copolymerized units of ethylene and about 20 to about 30 wt % of copolymerized acrylic or methacrylic acid. The first precursor acid copolymer has a melt flow rate of about 70 to about 1000 g/10 min. When neutralized to a level of about 40% to about 90% and when comprising counterions that consist essentially of sodium cations, the first precursor acid copolymer produces a sodium ionomer that has a melt flow rate of about 0.7 to about 25 g/10 min and a freeze enthalpy that is not detectable or that is less than about 3.0 j/g. The ionomer sheet may further comprise a second ionomer that is different from the first ionomer.

29 Claims, 3 Drawing Sheets

U.S. PATENT DOCUMENTS

| | | | |
|---|---|---|---|
| 5,741,370 A | 4/1998 | Hanoka | |
| 5,762,720 A | 6/1998 | Hanoka et al. | |
| 5,770,312 A | 6/1998 | Robinson | |
| 5,827,559 A | 10/1998 | Powell | |
| 5,853,516 A | 12/1998 | Lehto | |
| 5,948,176 A | 9/1999 | Ramanathan et al. | |
| 5,986,203 A | 11/1999 | Hanoka et al. | |
| 5,994,163 A | 11/1999 | Bodegard et al. | |
| 6,040,521 A | 3/2000 | Kushiya et al. | |
| 6,075,202 A | 6/2000 | Mori et al. | |
| 6,093,581 A | 7/2000 | Takabayashi | |
| 6,114,046 A | 9/2000 | Hanoka | |
| 6,137,048 A | 10/2000 | Wu et al. | |
| 6,150,028 A | 11/2000 | Mazon | |
| 6,187,448 B1 | 2/2001 | Hanoka et al. | |
| 6,204,443 B1 | 3/2001 | Kiso et al. | |
| 6,258,620 B1 | 7/2001 | Morel et al. | |
| 6,320,115 B1 | 11/2001 | Kataoka et al. | |
| 6,320,116 B1 | 11/2001 | Hanoka | |
| 6,323,416 B1 | 11/2001 | Komori et al. | |
| 6,340,646 B1 | 1/2002 | Nagashima et al. | |
| 6,342,116 B1 | 1/2002 | Balduin et al. | |
| 6,353,042 B1 | 3/2002 | Hanoka et al. | |
| 6,455,161 B1 * | 9/2002 | Regnier et al. | 428/412 |
| 6,461,736 B1 | 10/2002 | Hagashima et al. | |
| 6,468,934 B2 | 10/2002 | Hagashima et al. | |
| 6,518,365 B1 | 2/2003 | Powell et al. | |
| 6,521,825 B2 | 2/2003 | Miura et al. | |
| 6,660,930 B1 | 12/2003 | Gonsiorawski | |
| 6,818,819 B2 | 11/2004 | Morizane et al. | |
| 7,763,360 B2 | 7/2010 | Paul et al. | |
| 7,951,865 B1 | 5/2011 | Paul et al. | |
| 2003/0000568 A1 | 1/2003 | Gonsiorawski | |
| 2003/0004011 A1 | 1/2003 | Takesue et al. | |
| 2003/0124296 A1 | 7/2003 | Smith | |
| 2004/0182493 A1 | 9/2004 | Chick | |
| 2005/0279401 A1 | 12/2005 | Arhart et al. | |
| 2006/0182983 A1 | 8/2006 | Paul et al. | |
| 2007/0079866 A1 | 4/2007 | Borden et al. | |
| 2007/0092706 A1 * | 4/2007 | Pesek et al. | 428/220 |
| 2007/0196630 A1 | 8/2007 | Hayes et al. | |
| 2007/0209699 A1 | 9/2007 | Sichanugrist et al. | |
| 2007/0227578 A1 | 10/2007 | Perozziello et al. | |
| 2007/0232057 A1 | 10/2007 | Borden et al. | |
| 2007/0238285 A1 | 10/2007 | Borden | |
| 2007/0240759 A1 | 10/2007 | Borden | |
| 2007/0281090 A1 | 12/2007 | Kurita et al. | |
| 2007/0289693 A1 * | 12/2007 | Anderson et al. | 156/99 |
| 2007/0298590 A1 | 12/2007 | Choi et al. | |
| 2008/0023063 A1 | 1/2008 | Hayes et al. | |
| 2008/0044666 A1 | 2/2008 | Anderson et al. | |
| 2010/0108125 A1 | 5/2010 | Hayes et al. | |
| 2010/0112253 A1 | 5/2010 | Hausmann et al. | |
| 2010/0163099 A1 | 7/2010 | Hayes et al. | |

FOREIGN PATENT DOCUMENTS

| | | |
|---|---|---|
| EP | 1235683 A1 | 9/2002 |
| WO | 9101880 A1 | 2/1991 |
| WO | 0006619 A1 | 2/2000 |
| WO | 03057478 A1 | 7/2003 |

OTHER PUBLICATIONS

Response for European patent application 09 744892.2-2124 dated Dec. 22, 2011.

ASTM International Designation D 3418-99, Standard Test Method for Transition Temperatures of Polymers by Differential Scanning Calorimetry, 1999.

ASTM International Designation D3418-03, Standard Test Method for Transition Temperatures and Enthalpies of Fusion and Crystallization of Polymers by Differential Scanning Calorimetry, 2003.

ASTM International Designation D3418-08, Standard Test Method for Transition Temperatures and Enthalpies of Fusion and Crystallization of Polymers by Differential Scanning Calorimetry, 2008.

ASTM International Designation D3417-99, Standard Test Method for Enthalpies of Fusion and Crystallization of Polymers by Differential Scanning Calorimetry (DSC), 1999.

* cited by examiner

SOLAR CELLS MODULES COMPRISING LOW HAZE ENCAPSULANTS

CROSS-REFERENCE TO RELATED APPLICATION

This application claims priority to U.S. Provisional Appln. No. 61/110,486, filed on Oct. 31, 2008, and U.S. Provisional Appln. No. 61/141,440, filed on Dec. 30, 2008, which are incorporated herein by reference in their entirety.

FIELD OF THE INVENTION

The invention relates to a solar cell module having an encapsulant that comprises an ionomer composition. In particular, the encapsulant has improved optical properties, including lower haze.

BACKGROUND OF THE INVENTION

Several patents and publications are cited in this description in order to more fully describe the state of the art to which this invention pertains. The entire disclosure of each of these patents and publications is incorporated by reference herein.

Because solar cells provide a sustainable energy resource, their use is rapidly expanding. Solar cells can typically be categorized into two types based on the light absorbing material used, i.e., bulk or wafer-based solar cells and thin film solar cells.

Monocrystalline silicon (c-Si), poly- or multi-crystalline silicon (poly-Si or mc-Si) and ribbon silicon are the materials used most commonly in forming the more traditional wafer-based solar cells. Solar cell modules derived from wafer-based solar cells often comprise a series of self-supporting wafers (or cells) that are soldered together. The wafers generally have a thickness of between about 180 and about 240 µm. Such a panel of solar cells is called a solar cell layer and it may further comprise electrical wirings such as cross ribbons connecting the individual cell units and bus bars having one end connected to the cells and the other exiting the module. The solar cell layer is then further laminated to encapsulant layer(s) and protective layer(s) to form a weather resistant module that may be used for at least 20 years. In general, a solar cell module derived from wafer-based solar cell(s) comprises, in order of position from the front sun-facing side to the back non-sun-facing side: (1) an incident layer (or front sheet), (2) a front encapsulant layer, (3) a solar cell layer, (4) a back encapsulant layer, and (5) a backing layer (or backsheet). In such modules, it is essential that the materials positioned to the sun-facing side of the solar cell layer (i.e., the incident layer and the front encapsulant layer) have good transparency to allow sufficient sunlight to reach the solar cells. In addition, some modules may comprise bi-facial solar cells, where the solar cells are able to generate electrical power from sunlight directly reaching the sun-facing side thereof and by receiving sunlight that is reflected back to the non-sun-facing side thereof. In such modules it is essential that all the materials surrounding the solar cell layer be sufficiently transparent.

The increasingly important alternative thin film solar cells are commonly formed from materials that include amorphous silicon (a-Si), microcrystalline silicon (µc-Si), cadmium telluride (CdTe), copper indium selenide ($CuInSe_2$ or CIS), copper indium/gallium diselenide ($CuIn_xGa_{(1-x)}Se_2$ or CIGS), light absorbing dyes, and organic semiconductors. By way of example, thin film solar cells are disclosed in e.g., U.S. Pat. Nos. 5,507,881; 5,512,107; 5,948,176; 5,994,163; 6,040,521; 6,137,048; and 6,258,620 and U.S. Patent Publication Nos. 20070298590; 20070281090; 20070240759; 20070232057; 20070238285; 20070227578; 20070209699; and 20070079866. Thin film solar cells with a typical thickness of less than 2 µm are produced by depositing the semiconductor layers onto a superstrate or substrate formed of glass or a flexible film. During manufacture, it is common to include a laser scribing sequence that enables the adjacent cells to be directly interconnected in series, with no need for further solder connections between cells. As with wafer cells, the solar cell layer may further comprise electrical wirings such as cross ribbons and bus bars. Similarly, the thin film solar cells are further laminated to other encapsulant and protective layers to produce a weather resistant and environmentally robust module. Depending on the sequence in which the multi-layer deposition is carried out, the thin film solar cells may be deposited on a superstrate that ultimately serves as the incident layer in the final module, or the cells may be deposited on a substrate that ends up serving as the backing layer in the final module. Therefore, a solar cell module derived from thin film solar cells may have one of two types of construction. The first type includes, in order of position from the front sun-facing side to the back non-sun-facing side, (1) a solar cell layer comprising a superstrate and a layer of thin film solar cell(s) deposited thereon at the non-sun-facing side, (2) a (back) encapsulant layer, and (3) a backing layer. The second type may include, in order of position from the front sun-facing side to the back non-sun-facing side, (1) an incident layer, (2) a (front) encapsulant layer, (3) a solar cell layer comprising a layer of thin film solar cell(s) deposited on a substrate at the sun-facing side thereof.

The encapsulant layers used in solar cell modules are designed to encapsulate and protect the fragile solar cells. Suitable polymer materials for solar cell encapsulant layers typically possess a combination of characteristics such as high impact resistance, high penetration resistance, good ultraviolet (UV) light resistance, good long term thermal stability, adequate adhesion strength to glass and other rigid polymeric sheets, high moisture resistance, and good long term weatherability.

Ionomers are copolymers produced by partially or fully neutralizing the carboxylic acid groups of precursor or parent polymers that are acid copolymers usually comprising copolymerized residues of α-olefins and α,β-ethylenically unsaturated carboxylic acids. In recent years, certain types of ionomers have been used as solar cell encapsulant materials. See, e.g., U.S. Pat. Nos. 5,476,553; 5,478,402; 5,733,382; 5,741,370; 5,762,720; 5,986,203; 6,114,046; 6,187,448; 6,353,042; 6,320,116; and 6,660,930, and U.S. Patent publication Nos. 20030000568 and 20050279401.

It is apparent from the foregoing that a need exists to improve the optical properties of the ionomer encapsulants so that solar cells may generate the highest possible power output.

SUMMARY OF THE INVENTION

Disclosed herein is a solar cell module comprising a solar cell layer and an ionomer sheet comprising an ionomer composition, said ionomer composition comprises a first ionomer that is the neutralized product of a first precursor acid copolymer, wherein, (A) the first precursor acid copolymer comprises copolymerized units of a first α-olefin having 2 to 10 carbon atoms and about 20 to about 30 wt %, based on the total weight of the first precursor acid copolymer, of copolymerized units of a first α,β-ethylenically unsaturated carboxylic acid having 3 to 8 carbon atoms; (B) the first precursor acid copolymer has a melt flow rate of about 70 to about 1000 g/10 min, as determined in accordance with ASTM D1238 at 190° C. and 2.16 kg; and (C) the first precursor acid copolymer, when neutralized to a level of about 40% to about 90% and when comprising counterions that consist essentially of sodium cations, produces a sodium ionomer, and said sodium ionomer has a melt flow rate of about 0.7 to about 25 g/10 min and a freeze enthalpy that is not detectable or that is less than about 3.0 j/g, when determined by differential scanning calorimetry (DSC) in accordance with ASTM D3418. The ionomer composition may further comprise a second ionomer that is the neutralization product of a second precursor acid copolymer, wherein, (D) the second precursor acid copolymer comprises copolymerized units of a second α-olefin having 2 to 10 carbon atoms and about 18 to about 30 wt % of copolymerized units of a second α,β-ethylenically unsaturated carboxylic acid having 3 to 8 carbon atoms; (E) the second α-olefin may be the same as or different from the first α-olefin; and the second α,β-ethylenically unsaturated carboxylic acid may be the same as or different from the first α,β-ethylenically unsaturated carboxylic acid; and (F) the second precursor acid copolymer has a melt flow rate of about 60 g/10 min or less; and (G) the second ionomer has a melt flow rate of about 10 g/10 min or less, as determined in accordance with ASTM D1238 at 190° C. and 2.16 kg.

In one embodiment, the ionomer sheet is in the form of a monolayer sheet and consists essentially of the ionomer composition described above.

In a further embodiment, the ionomer sheet is in the form of a multilayer sheet and comprises two or more sub-layers, wherein at least one of the sub-layers consists essentially of the ionomer composition described above and each of the other sub-layer(s) comprises a polymer selected from the group consisting of acid copolymers, ionomers of acid copolymers, poly(ethylene vinyl acetates), poly(vinyl acetals), polyurethanes, polyvinylchlorides, polyethylenes, polyolefin block copolymer elastomers, copolymers of an α-olefin and an α,β-ethylenically unsaturated carboxylic acid ester, silicone elastomers, epoxy resins, and combinations of two or more thereof.

In a yet further embodiment, the ionomer sheet has a total thickness of about 1 to about 120 mils (about 0.025 to about 3 mm) or about 10 to about 60 mils (about 0.25 to about 1.5 mm).

In a yet further embodiment, the ionomer sheet is directly laminated to the solar cell layer.

In a yet further embodiment, the solar cell layer has a front sun-facing side and a back non-sun-facing side. In such an embodiment, the solar cell module may comprise a front encapsulant layer laminated to the sun-facing side of the solar cell layer and a back encapsulant layer laminated to the non-sun-facing side of the solar cell layer, wherein one of the front and back encapsulant layers is the ionomer sheet described above and the other of the front and back encapsulant layers comprises a polymeric material selected from the group consisting of acid copolymers, ionomers of acid copolymers, poly(ethylene vinyl acetates), poly(vinyl acetals), polyurethanes, polyvinylchlorides, polyethylenes, polyolefin block copolymer elastomers, copolymers of an α-olefin and an α,β-ethylenically unsaturated carboxylic acid ester, silicone elastomer epoxy resins, and combinations of two or more of these materials. Or, the solar cell module may comprise two of the ionomer sheets described above, wherein each of the front and back encapsulant layers is one of the two ionomer sheets. Further, the solar cell module may comprise an incident layer and/or a backing layer.

In a yet further embodiment, the solar cells are wafer-based solar cells selected from the group consisting of crystalline silicon (c-Si) and multi-crystalline silicon (mc-Si) based solar cells and the solar cell module consists essentially of, in order of position, (i) an incident layer, (ii) a front encapsulant layer laminated to the sun-facing side of the solar cell layer, (iii) the solar cell layer, (iv) a back encapsulant layer laminated to the non-light receiving side of the solar cell layer, and (v) a backing layer, wherein one or both of the front and back encapsulant layers are the ionomer sheets described above.

In a yet further embodiment, the solar cells are thin film solar cells selected from the group consisting of amorphous silicon (a-Si), microcrystalline silicon (μc-Si), cadmium telluride (CdTe), copper indium selenide (CIS), copper indium/gallium diselenide (CIGS), light absorbing dyes, and organic semiconductor based solar cells. The module may consist essentially of, in order of position, (i) an incident layer, (ii) a front encapsulant layer comprising the ionomer sheet described above, and (iii) the solar cell layer, wherein the solar cell layer further comprises a substrate upon which the thin film solar cells are deposited and the substrate is positioned such that the substrate is an outermost surface of the module and is positioned on the non-sun-facing side of the solar cell layer. Or the module may consist essentially of, in order of position (i) the solar cell layer, (ii) a back encapsulant layer comprising the ionomer sheet described above, and (iii) a backing layer, wherein the solar cell layer further comprises a superstrate upon which the thin film solar cells are deposited and the superstrate is positioned such that the superstrate is an outermost surface of the module on the sun-facing side of the solar cell layer.

Also disclosed herein is a process for preparing a solar cell module, comprising: (i) providing an assembly comprising all the component layers as described above and (ii) laminating the assembly to form the solar cell module.

In one embodiment, the laminating step is conducted by subjecting the assembly to heat and optionally vacuum or pressure.

DETAILED DESCRIPTION OF THE INVENTION

The following definitions apply to the terms as used throughout this specification, unless otherwise limited in specific instances.

The technical and scientific terms used herein have the meanings that are commonly understood by one of ordinary skill in the art to which this invention belongs. In case of conflict, the present specification, including the definitions herein, will control.

The term "a finite amount", as used herein, refers to an amount that is greater than zero.

As used herein, the terms "comprises," "comprising," "includes," "including," "containing," "characterized by," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The transitional phrase "consisting of" excludes any element, step, or ingredient not specified in the claim, closing the claim to the inclusion of materials other than those recited except for impurities ordinarily associated therewith. When the phrase "consists of" appears in a clause of the body of a claim, rather than immediately following the preamble, it limits only the element set forth in that clause; other elements are not excluded from the claim as a whole.

The transitional phrase "consisting essentially of" limits the scope of a claim to the specified materials or steps and those that do not materially affect the basic and novel characteristic(s) of the claimed invention. A 'consisting essentially of' claim occupies a middle ground between closed claims that are written in a 'consisting of' format and fully open claims that are drafted in a 'comprising' format. Optional additives as defined herein, at a level that is appropriate for such additives, and minor impurities are not excluded from a composition by the term "consisting essentially of".

When a composition, a process, a structure, or a portion of a composition, a process, or a structure, is described herein using an open-ended term such as "comprising," unless otherwise stated the description also includes an embodiment that "consists essentially of" or "consists of" the elements of the composition, the process, the structure, or the portion of the composition, the process, or the structure.

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

The term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

The term "or", as used herein, is inclusive; that is, the phrase "A or B" means "A, B, or both A and B". More specifically, a condition "A or B" is satisfied by any one of the following: A is true (or present) and B is false (or not present); A is false (or not present) and B is true (or present); or both A and B are true (or present). Exclusive "or" is designated herein by terms such as "either A or B" and "one of A or B", for example.

In addition, the ranges set forth herein include their endpoints unless expressly stated otherwise. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. The scope of the invention is not limited to the specific values recited when defining a range.

When materials, methods, or machinery are described herein with the term "known to those of skill in the art", "conventional" or a synonymous word or phrase, the term signifies that materials, methods, and machinery that are conventional at the time of filing the present application are encompassed by this description. Also encompassed are materials, methods, and machinery that are not presently conventional, but that will have become recognized in the art as suitable for a similar purpose.

Unless stated otherwise, all percentages, parts, ratios, and like amounts, are defined by weight.

The terms "freeze enthalpy", "heat of crystallization" and "enthalpy of crystallization", as used herein, are synonymous and interchangeable. The terms "heat of crystallization" and "enthalpy of crystallization" are defined in ASTM Method No. D3418, published in December, 2008.

As used herein, the term "copolymer" refers to polymers comprising copolymerized units resulting from copolymerization of two or more comonomers. In this connection, a copolymer may be described herein with reference to its constituent comonomers or to the amounts of its constituent comonomers, for example "a copolymer comprising ethylene and 15 weight % of acrylic acid", or a similar description. Such a description may be considered informal in that it does not refer to the comonomers as copolymerized units; in that it does not include a conventional nomenclature for the copolymer, for example International Union of Pure and Applied Chemistry (IUPAC) nomenclature; in that it does not use product-by-process terminology; or for another reason. As used herein, however, a description of a copolymer with reference to its constituent comonomers or to the amounts of its constituent comonomers means that the copolymer contains copolymerized units (in the specified amounts when specified) of the specified comonomers. It follows as a corollary that a copolymer is not the product of a reaction mixture containing given comonomers in given amounts, unless expressly stated in limited circumstances to be such.

The term "dipolymer" refers to polymers consisting essentially of two monomers, and the term "terpolymer" refers to polymers consisting essentially of three monomers.

The term "acid copolymer" as used herein refers to a polymer comprising copolymerized units of an α-olefin, an α,β-ethylenically unsaturated carboxylic acid, and optionally other suitable comonomer(s) such as, an α,β-ethylenically unsaturated carboxylic acid ester.

The term "ionomer" as used herein refers to a polymer that comprises ionic groups that are metal ion carboxylates, for example, alkali metal carboxylates, alkaline earth carboxylates, transition metal carboxylates and/or mixtures of such carboxylates. Such polymers are generally produced by partially or fully neutralizing the carboxylic acid groups of precursor or parent polymers that are acid copolymers, as defined herein, for example by reaction with a base. An example of an alkali metal ionomer is a sodium ionomer (or sodium neutralized ionomer), for example a copolymer of ethylene and methacrylic acid wherein all or a portion of the carboxylic acid groups of the copolymerized methacrylic acid units are in the form of sodium carboxylates.

Provided herein is a solar cell module comprising (A) at least one layer that is a sheet comprising at least one layer that comprises or is produced from an ionomer composition and (B) a solar cell layer comprising one or a plurality of solar cells. The sheet functions as an encapsulant layer in the solar cell module. That is, the solar cell modules of the present invention are characterized by having an encapsulant layer having at least one layer of the ionomer composition.

The ionomer composition comprises an ionomer that is an ionic, neutralized derivative of a precursor acid copolymer. The precursor acid copolymer comprises copolymerized units of an α-olefin having 2 to 10 carbons and about 20 to about 30 wt %, or about 20 to about 25 wt %, of copolymerized units of an α,β-ethylenically unsaturated carboxylic acid having 3 to 8 carbons, based on the total weight of the precursor acid copolymer.

Suitable α-olefin comonomers include, but are not limited to, ethylene, propylene, 1-butene, 1-pentene, 1-hexene, 1-heptene, 3 methyl-1-butene, 4-methyl-1-pentene, and the like and mixtures of two or more of these α-olefins. Preferably, the α-olefin is ethylene.

Suitable α,β-ethylenically unsaturated carboxylic acid comonomers include, but are not limited to, acrylic acids, methacrylic acids, itaconic acids, maleic acids, maleic anhydrides, fumaric acids, monomethyl maleic acids, and mixtures of two or more of these acid comonomers. Preferably, the α,β-ethylenically unsaturated carboxylic acid is selected from acrylic acids, methacrylic acids, and mixtures of two or more acrylic acids or methacrylic acids.

The precursor acid copolymers may further comprise copolymerized units of other comonomer(s), such as unsaturated carboxylic acids having 2 to 10, or preferably 3 to 8 carbons, or derivatives thereof. Suitable acid derivatives include acid anhydrides, amides, and esters. Esters are preferred. Specific examples of preferred esters of unsaturated carboxylic acids include, but are not limited to, methyl acrylates, methyl methacrylates, ethyl acrylates, ethyl methacrylates, propyl acrylates, propyl methacrylates, isopropyl acrylates, isopropyl methacrylates, butyl acrylates, butyl methacrylates, isobutyl acrylates, isobutyl methacrylates, tert-butyl acrylates, tert-butyl methacrylates, octyl acrylates, octyl methacrylates, undecyl acrylates, undecyl methacrylates, octadecyl acrylates, octadecyl methacrylates, dodecyl acrylates, dodecyl methacrylates, 2-ethylhexyl acrylates, 2-ethylhexyl methacrylates, isobornyl acrylates, isobornyl methacrylates, lauryl acrylates, lauryl methacrylates, 2-hydroxyethyl acrylates, 2-hydroxyethyl methacrylates, glycidyl acrylates, glycidyl methacrylates, poly(ethylene glycol)acrylates, poly(ethylene glycol)methacrylates, poly(ethylene glycol) methyl ether acrylates, poly(ethylene glycol) methyl ether methacrylates, poly(ethylene glycol) behenyl ether acrylates, poly(ethylene glycol) behenyl ether methacrylates, poly(ethylene glycol) 4-nonylphenyl ether acrylates, poly(ethylene glycol) 4-nonylphenyl ether methacrylates, poly(ethylene glycol) phenyl ether acrylates, poly(ethylene glycol) phenyl ether methacrylates, dimethyl maleates, diethyl maleates, dibutyl maleates, dimethyl fumarates, diethyl fumarates, dibutyl fumarates, vinyl acetates, vinyl propionates, and mixtures of two or more thereof. Examples of preferable suitable comonomers include, but are not limited to, methyl acrylates, methyl methacrylates, butyl acrylates, butyl methacrylates, glycidyl methacrylates, vinyl acetates, and mixtures of two or more thereof. Preferably, however, the precursor acid copolymer does not incorporate other comonomers in any significant amount.

Mixtures of precursor acid copolymers are also suitable, provided that the properties of the copolymers are within the ranges described herein. For example, two or more dipolymers having differing amounts of copolymerized carboxylic acid comonomer or differing melt indices may be used. Also, a mixture of precursor acid copolymers including a dipolymer and a terpolymer may be suitable.

The precursor acid copolymer may have a melt flow rate (MFR) of about 70 to about 1000 g/10 min, or about 100 to about 500 g/10 min, or about 150 to about 300 g/10 min, or about 200 to about 250 g/10 min, as determined in accordance with ASTM method D1238 at 190° C. and 2.16 kg.

The precursor acid copolymers may be synthesized in a continuous process in which each of the reactive comonomers and the solvent(s), if any, are continuously fed, together with initiator, into a stirred reactor. The choice of initiator is based on the anticipated reactor temperature range coupled with the decomposition temperature of the initiator, the criteria for this selection being well-understood in the industry. In general, during the synthesis by copolymerization of ethylene and acid comonomers to produce the precursor acid copolymer, the reaction temperature may be maintained at about 120° C. to about 300° C., or about 140° C. to about 260° C. The pressure in the reactor may be maintained at about 130 to about 310 MPa, or about 165 to 250 MPa.

The reactor may be, for example, an autoclave such as those disclosed in U.S. Pat. No. 2,897,183. Specifically, U.S. Pat. No. 2,897,183 describes a type of autoclave that is equipped with means for intensive agitation. It also describes a continuous process for the polymerization of ethylene under a "substantially constant environment." This environment is maintained by keeping certain parameters for example, pressure, temperature, initiator concentration and the ratio of polymer product to unreacted ethylene, substantially constant during the polymerization reaction. Such conditions may be achieved in any of a variety of continuously stirred tank reactors, among them, for example, continuously stirred isothermal reactors and continuously stirred adiabatic reactors.

The reaction mixture, which contains the ethylene copolymer product, is vigorously agitated and continuously removed from the autoclave. After the reaction mixture leaves the reaction vessel, the resulting ethylene copolymer product is separated from the volatile unreacted monomers and solvents, if any, by conventional procedures, such as by vaporizing the unpolymerized materials and solvents under reduced pressure or at an elevated temperature.

In general, to obtain the ionomers described herein, during the polymerization reaction, the reactor contents should be maintained under conditions such that a single phase is present substantially throughout the reactor. This can be accomplished by adjusting reactor temperature, by adjusting reactor pressure, by addition of co-solvents, or any combination thereof, as disclosed in U.S. Pat. No. 5,028,674. Any conventional means may be used to determine whether a single phase is maintained substantially throughout the reactor. For example, Hasch et al. in "High-Pressure Phase Behavior of Mixtures of Poly(Ethylene-co-Methyl Acrylate) with Low-Molecular Weight Hydrocarbons", Journal of Polymer Science: Part B: Polymer Physics, Vol. 30, 1365-1373 (1992), describe a cloud-point measurement that can be used in determining the boundary between single-phase and multiphase conditions.

To obtain the ionomers useful in the ionomer compositions described herein, the precursor acid copolymers are neutralized with a base so that the carboxylic acid groups in the precursor acid copolymer react to form carboxylate groups. Preferably, the precursor acid copolymers groups are neutralized to a level of about 20 to about 90 wt %, or about 30% to about 90%, or about 35% to about 90%, or about 40% to about 90%, or about 40% to about 70%, or about 43% to about 60%, based on the total carboxylic acid content of the precursor acid copolymers as calculated or measured for the non-neutralized precursor acid copolymers.

Although any stable cation is believed to be suitable as a counterion to the carboxylate groups in the ionomer, divalent and monovalent cations, such as cations of alkali metals, alkaline earth metals, and some transition metals, are preferred. Zinc cations are preferred divalent ions. Monovalent cations such as sodium cations are more preferred. For example, the base may be a zinc ion-containing base, to provide a zinc ionomer where about 10% to about 60% or about 15% to about 45%, or about 15% to about 30% of the hydrogen atoms of the carboxylic acid groups of the precursor acid are replaced by zinc cations. Such zinc ionomers may be preferred in some embodiments due to their good moisture resistance properties. Still more preferably, the base is a sodium ion-containing base, to provide a sodium ionomer wherein about 40% to about 90%, or about 40% to about 70%, or about 43% to about 60% of the hydrogen atoms of the carboxylic acid groups of the precursor acid are replaced by sodium cations.

To obtain the ionomers used herein, the precursor acid copolymers may be neutralized by any conventional procedure, such as those disclosed in U.S. Pat. Nos. 3,404,134 and 6,518,365.

It is noted that when the precursor acid copolymer is neutralized by a sodium ion-containing base to a degree of about 40% to about 90%, or about 40% to about 70%, or about 43% to about 60%, the as-neutralized sodium ionomer may have a MFR of about 0.7 to about 25 g/10 min or less, or about 0.7 to about 19 g/10 min or less, or about 1 to about 10 g/10 min, or about 1.5 to about 5 g/10 min, or about 2 to about 4 g/10 min, as determined in accordance with ASTM method D1238 at 190° C. and 2.16 kg. Further, the as neutralized sodium ionomer may have a freeze enthalpy that is not detectable or less than about 3 j/g, or less than about 2 j/g, as determined by differential scanning calorimetry (DSC) in accordance with ASTM method D3418 when using a DSC apparatus manufactured by Mettler or by thermal analysis (TA) (for example the Universal V3.9A model). By "not detectable", it is meant there is no observable inflection on the DSC curve. Alternatively, the peak height may be very small and the peak width at half height may be relatively great, so that a broad peak having a small integral area may not be discerned when a baseline is subtracted from the DSC trace. In general, when ASTM D3418 is followed, a freeze enthalpy that falls below 0.2 j/g would not be detectable.

In a further embodiment, the ionomer composition may be an ionomer blend composition further comprising a second ionomer that is distinct from the above-described ionomer. From this point forward, the ionomer above described may also be referred to as "the first ionomer", that is an ionic neutralized product of "the first precursor acid copolymer". The blend composition may comprise, based on the total weight of the blend composition, about 5 to about 95 wt % of the first ionomer and about 5 to about 95 wt % of the second ionomer, or about 60 to about 95 wt % of the first ionomer and about 5 to about 40 wt % of the second ionomer, or about 70 to about 90 wt % of the first ionomer and about 10 to about 30 wt % of the second ionomer, or about 70 to about 80 wt % of the first ionomer and about 20 to about 30 wt % of the second ionomer.

The second ionomer used in the blend composition is an ionic, neutralized derivative of a second precursor acid copolymer comprising copolymerized units of an α-olefin having 2 to 10 carbon atoms and about 18 to about 30 wt %, or about 20 to about 25 wt %, or about 21 to about 24 wt % of copolymerized units of an α,β-ethylenically unsaturated carboxylic acid having 3 to 8 carbon atoms. The second precursor acid copolymer may have a melt flow rate (MFR) of about 60 g/10 min or less, or about 45 g/10 min or less, or about 30 g/10 min or less, or about 25 g/10 min or less, as determined in accordance with ASTM method D1238 at 190° C. and 2.16 kg. To obtain the second ionomer used in the blend composition, the second precursor acid copolymer may be neutralized with one or more ion-containing bases to provide an ionomer wherein about 10% to about 35%, or about 15% to about 30% of the hydrogen atoms of carboxylic acid groups of the second precursor acid copolymer is replaced by metal cations. That is, the acid groups are neutralized to a level of about 10% to about 35%, or about 15% to about 30%, based on the total carboxylic acid content of the second precursor acid copolymer as calculated or measured for the non-neutralized second precursor acid copolymer. The thus obtained second ionomer may have a MFR of about 10 g/10 min or less, or about 5 g/10 min or less, or about 3 g/10 min or less, as determined in accordance with ASTM method D1238 at 190° C. and 2.16 kg.

Suitable α-olefin and α,β-ethylenically unsaturated carboxylic acids comprising the second precursor acid copolymers may be selected from the a-olefin and α,β-ethylenically unsaturated carboxylic acids disclosed above for the first precursor acid copolymer. The second precursor acid copolymer may also further comprise copolymerized units of other comonomer(s), such as those described above in reference to the first precursor acid copolymer. The second ionomer may be prepared the same manner as the first ionomer is prepared. And, the ionomer blend composition may be prepared by any suitable blending process, such as melt blending.

The ionomer compositions described herein may further contain any suitable additive known in the art. Such additives include, but are not limited to, plasticizers, processing aids, flow enhancing additives, flow reducing additives (e.g., organic peroxides), lubricants, pigments, dyes, optical brighteners, flame retardants, impact modifiers, nucleating agents, antiblocking agents (e.g., silica), thermal stabilizers, hindered amine light stabilizers (HALS), UV absorbers, UV stabilizers, dispersants, surfactants, chelating agents, coupling agents, adhesives, primers, reinforcement additives (e.g., glass fiber), fillers, and the like, and mixtures or combinations of two or more conventional additives. These additives are described in the *Kirk Othmer Encyclopedia of Chemical Technology*, 5$^{th}$ Edition, John Wiley & Sons (New Jersey, 2004), for example. Generally, additives that may reduce the optical clarity of the composition, such as reinforcement additives and fillers, are reserved for those sheets that are used as the back encapsulants.

These conventional ingredients may be present in the compositions in quantities that are generally from 0.01 to 15 weight %), preferably from 0.01 to 10 weight %), so long as they do not detract from the basic and novel characteristics of the composition and do not significantly adversely affect the performance of the composition or of the articles prepared from the composition. In this connection, the weight percentages of such additives are not included in the total weight percentages of the thermoplastic compositions defined herein. Typically, many such additives may be present in from 0.01 to 5 weight %), based on the total weight of the ionomer composition.

The optional incorporation of such conventional ingredients into the compositions can be carried out by any known process. This incorporation can be carried out, for example, by dry blending, by extruding a mixture of the various constituents, by the conventional masterbatch technique, or the like. See *Kirk Othmer Encyclopedia of Chemical Technology*, 5$^{th}$ Edition, John Wiley & Sons (New Jersey, 2004).

Four notable additives are thermal stabilizers, UV absorbers, hindered amine light stabilizers, and silane coupling agents. Thermal stabilizers can be used and have been widely disclosed within the art. Any known thermal stabilizer may be suitable for use in the ionomer composition. Preferred general classes of thermal stabilizers include, but are not limited to, phenolic antioxidants, alkylated monophenols, alkylthiomethylphenols, hydroquinones, alkylated hydroquinones, tocopherols, hydroxylated thiodiphenyl ethers, alkylidenebisphenols, O-, N- and S-benzyl compounds, hydroxybenzylated malonates, aromatic hydroxybenzyl compounds, triazine compounds, aminic antioxidants, aryl amines, diaryl amines, polyaryl amines, acylaminophenols, oxamides, metal deactivators, phosphites, phosphonites, benzylphosphonates, ascorbic acid (vitamin C), compounds that destroy peroxide, hydroxylamines, nitrones, thiosynergists, benzofuranones, indolinones, and the like and mixtures thereof. The ionomer composition may contain any effective amount of thermal stabilizer. Use of a thermal stabilizer is optional and in some instances is not preferred. When thermal stabilizers are used, they may be present in the ionomer compositions at a level of at least about 0.05 wt % and up to about 10 wt %, more preferably up to about 5 wt %, and most preferably up to about 1 wt %, based on the total weight of the ionomer composition.

UV absorbers can be used and have also been widely disclosed within the art. Any known UV absorber may be suitable for use in the ionomer compositions. Preferred general classes of UV absorbers include, but are not limited to, benzotriazoles, hydroxybenzophenones, hydroxyphenyl triazines, esters of substituted and unsubstituted benzoic acids, and the like and mixtures thereof. The ionomer compositions may contain any effective amount of UV absorbers. Use of a UV absorber is optional and in some instances is not preferred. When UV absorbers are utilized, they may be present in the ionomer compositions at a level of at least about 0.05 wt %, and up to about 10 wt %, more preferably up to about 5 wt %, and most preferably up to about 1 wt %, based on the total weight of the ionomer composition.

Hindered amine light stabilizers (HALS) can be used and have also been widely disclosed within the art. Generally, hindered amine light stabilizers are secondary, tertiary, acetylated, N-hydrocarbyloxy substituted, hydroxy substituted N-hydrocarbyloxy substituted, or other substituted cyclic amines which are characterized by a substantial amount of steric hindrance, generally derived from aliphatic substitution on the carbon atoms adjacent to the amine function. The ionomer compositions may contain any effective amount of hindered amine light stabilizers. Use of hindered amine light stabilizers is optional and in some instances is not preferred. When hindered amine light stabilizers are used, they may be present in the ionomer compositions at a level of at least about 0.05 wt %, and up to about 10 wt %, more preferably up to about 5 wt %, and most preferably, up to about 1 wt %, based on the total weight of the ionomer composition.

Examples of silane coupling agents that are useful in the ionomer compositions include, but are not limited to, γ-chloropropylmethoxysilane, vinyltrimethoxysilane, vinyltriethoxysilane, vinyltris(β-methoxyethoxy)silane, γ-vinylbenzylpropyltrimethoxysilane, N-β-(N-vinylbenzylaminoethyl)-γ-aminopropyltrimethoxysilane, γ-methacryloxypropyltrimethoxysilane, vinyltriacetoxysilane, γ-glycidoxypropyltrimethoxysilane, γ-glycidoxypropyltriethoxysilane, β-(3,4-epoxycyclohexyl)ethyltrimethoxysilane, vinyltrichlorosilane, γ-mercaptopropylmethoxysilane, γ-aminopropyltriethoxysilane, N-β-(aminoethyl)-γ-aminopropyltrimethoxysilane, and mixtures of two or more thereof. The silane coupling agents are preferably incorporated in the ionomer compositions at a level of about 0.01 to about 5 wt %, or more preferably about 0.05 to about 1 wt %, based on the total weight of the ionomer composition.

As demonstrated by the examples disclosed below, the solar cell encapsulants made from the ionomer compositions disclosed herein have improved optical properties. For example, compositions that comprises the first ionomer, in general, exhibit equal or better optical properties (e.g., equal or lower haze as determined in accordance with ASTM D1003) than those made from prior art ionomers. Moreover, such improved optical properties are not affected by the cooling rate of the encapsulant layer following its fabrication, nor by the cooling rate of the solar cell module that comprises the encapsulant layer.

The ionomer compositions useful in the invention are thermoplastic materials. Accordingly, articles comprising the ionomer compositions are most often formed by processes that include the step of melting the ionomer and the other components of the ionomer composition, and the step of shaping the desired article from the polymer melt. At the conclusion of the fabrication process, thicker articles may be cooled to room temperature at a slower rate due to the limitations of heat transfer and economic limitations that prevent the use of expensive cooling equipment. In general, a slow cooling rate is unfavorable for the optical properties of ionomers. Without wishing to be held to theory, it is believed that ethylene acid copolymers and their ionomers may have a high level of inhomogeneity (non-randomness) in the comonomer distribution along the length of the polymer chain. The result is that these materials include long stretches of consecutively copolymerized ethylene residues that are capable of organization into crystals, just as polyethylene itself has a well-known tendency to crystallize. See, for example, Longworth, R., in Ionic Polymers (L. Holliday, ed.), Halstead, New York, Ch. 2 (1975); and Morris, B. A., Chen, J. C. SEP ANTEC, 61(Vol. 3), 3157 (2003). Crystals above a certain size scatter light that would otherwise be transmitted through the article. Therefore, good optical properties, such as haze and clarity, deteriorate as crystallinity increases.

In contrast, the ionomer compositions described herein have good optical properties, even when cooled at very low rates. The exceptionally small or even unmeasurable freeze enthalpies of the ionomers described herein are evidence that these ionomers have no tendency, an insignificant tendency, or a very low tendency towards crystallization.

In addition, when the first ionomer is blended with the second ionomer, because the second ionomer is derived from the second acid copolymer having a relatively lower MFR (about 60 g/10 min or lower when determined in accordance with ASTM D1238 at 190° C. and 2.16 kg), the blend composition would be expected to have improved toughness compared to the less tough first ionomer. Moreover, as it is known within the art that the haze level of a two polymer blend is often increased compared to either of the two polymer components, by blending the first ionomer with the second ionomer, one would expect that the blend composition would have increased haze to levels in excess of that of either of the first and second ionomers. However, it has been surprisingly found that ionomer blends useful as encapsulant sheets in the solar cell module of the invention have haze levels lower than those of the second ionomer component. And in some embodiments, the ionomer blends useful as encapsulant sheets in the solar cell module of the invention exhibit haze levels lower than that of either the first or the second ionomer.

The sheet comprising the ionomer composition that functions as an encapsulant layer of the solar cell module of the invention, may be in a single layer or in multilayer form. By "single layer", it is meant that the sheet is made of or consists essentially of the ionomer composition. When in a multilayer form, at least one of the sub-layers is made of or consists essentially of the ionomer composition, while the other sub-layer(s) may be made of any other suitable polymeric material(s), such as, for example, acid copolymers as previously defined herein, ionomers of acid copolymers as previously defined herein, poly(ethylene vinyl acetates), poly(vinyl acetals) (including acoustic grade poly(vinyl acetals)), polyurethanes, polyvinylchlorides, polyethylenes (e.g., linear low density polyethylenes), polyolefin block copolymer elastomers, copolymers of α-olefins and α,β-ethylenically unsaturated carboxylic acid esters (e.g., ethylene methyl acrylate copolymers and ethylene butyl acrylate copolymers), silicone elastomers, epoxy resins, and combinations of two or more thereof.

Further the sheet comprising the ionomer composition may have total thickness of about 1 to about 120 mils (about 0.025 to about 3 mm), or about 10 to about 90 mils (about 0.25 to about 2.3 mm), or about 10 to about 60 mils (about 0.25 to about 1.5 mm), or about 10 to about 45 mils (about 0.25 to about 1.14 mm), or about 10 to about 35 mils (about 0.25 to about 0.89 mm).

The sheet comprising the ionomer composition may have a smooth or rough surface on one or both sides. Preferably, the sheet has rough surfaces on both sides to facilitate deaeration during the lamination process. Rough surfaces can be created by mechanically embossing or by melt fracture during extrusion of the sheets followed by quenching so that surface roughness is retained during handling. The surface pattern can be applied to the sheet through common art processes. For example, the as-extruded sheet may be passed over a specially prepared surface of a die roll positioned in close proximity to the exit of the die which imparts the desired surface characteristics to one side of the molten polymer. Thus, when the surface of such a die roll has minute peaks and valleys, the polymer sheet cast thereon will have a rough surface on the side that is in contact with the roll, and the rough surface generally conforms respectively to the valleys and peaks of the roll surface. Such die rolls are disclosed in, e.g., U.S. Pat. No. 4,035,549 and U.S. Patent Publication No. 2003/0124296.

The sheets comprising the ionomer composition can be produced by any suitable process. For example, the sheets may be formed through dipcoating, solution casting, compression molding, injection molding, lamination, melt extrusion, blown film, extrusion coating, tandem extrusion coating, or by any other procedures that are known to those of skill in the art. In certain embodiments, the sheets are formed by melt extrusion, melt coextrusion, melt extrusion coating, or tandem melt extrusion coating processes.

The term "solar cell" is meant to include any article which can convert light into electrical energy. Solar cells useful in the invention include, but are not limited to, wafer-based solar cells (e.g., c-Si or mc-Si based solar cells, as described above in the background section) and thin film solar cells (e.g., a-Si, μc-Si, CdTe, CIS, CIGS, light absorbing dyes, or organic semiconductor based solar cells, as described above in the background section). Within the solar cell layer, it is preferred that the solar cells are electrically interconnected and/or arranged in a flat plane. In addition, the solar cell layer may further comprise electrical wirings, such as cross ribbons and bus bars.

The solar cell layer may be bifacial. In such an embodiment, all the laminating materials positioned on either side of the solar cell layer should be sufficiently transparent to allow sunlight or reflected sunlight to reach the solar cells. Or, the solar cell layer may have a sun-facing side (which is also referred to as a front side and, when in actual use conditions, would generally face toward the sun) and a non-sun-facing side (which is also referred to as a back side and, in actual use conditions, would generally face away from the sun). In such an embodiment, all the materials that are present in the laminate layers and sub-layers positioned to the sun-facing side of the solar cell layer should have sufficient transparency to allow sunlight to reach the solar cells. The laminating materials present in the laminate layers and sub-layers positioned to the non-sun-facing side of the solar cell layer need not be transparent.

The solar cell module disclosed herein typically comprises at least one encapsulant sheet comprising the ionomer composition disclosed above, which is laminated to the solar cell layer. By "laminated", it is meant that, within a laminated structure, the two layers are bonded either directly (i.e., without any additional material between the two layers) or indirectly (i.e., with additional material, such as interlayer or adhesive materials, between the two layers). In certain embodiments, the encapsulant sheet comprising the ionomer composition is directly bonded to the solar cell layer.

The solar cell module may further comprise additional encapsulant layers comprising other polymeric materials, such as acid copolymers, ionomers of acid copolymers, ethylene/vinyl acetate copolymers, poly(vinyl acetals) (including acoustic grade poly(vinyl acetals)), polyurethanes, poly(vinyl chlorides), polyethylenes (e.g., linear low density polyethylenes), polyolefin block copolymer elastomers, copolymers of α-olefins and α,β-ethylenically unsaturated carboxylic acid esters) (e.g., ethylene methyl acrylate copolymers and ethylene butyl acrylate copolymers), silicone elastomers, epoxy resins, and combinations of two or more thereof.

The thickness of each of the encapsulant layers other than the sheet comprising the ionomer composition may independently range from about 1 to about 120 mils (about 0.025 to about 3 mm), or about 10 to about 90 mils (about 0.25 to about 2.3 mm), or about 15 to about 60 mils (about 0.38 to about 1.5 mm), or about 20 to about 60 mils (about 0.51 to about 1.5 mm), or about 20 to about 45 mils (about 0.51 to about 1.14 mm). Any or all of the encapsulant layer(s) comprised in the solar cell modules other than the sheet comprising the ionomer composition may have smooth or rough surfaces.

The solar cell module may further comprise an incident layer and/or a backing layer serving as the outermost layer or layers of the module at the sun-facing side and the non-sun-facing side of the solar cell module, respectively.

The outer layers of the solar cell modules, i.e., the incident layer and the backing layer, may be derived from any suitable sheets or films. Suitable sheets may be glass or plastic sheets, such as polycarbonates, acrylics, polyacrylates, cyclic polyolefins (e.g., ethylene norbornene polymers), polystyrenes (preferably polystyrenes prepared in the presence of metallocene catalysts), polyamides, polyesters, fluoropolymers, or combinations of two or more thereof. In addition, metal sheets, such as aluminum, steel, galvanized steel, or ceramic plates may be utilized in forming the backing layer.

The term "glass" includes not only window glass, plate glass, silicate glass, sheet glass, low iron glass, tempered glass, tempered CeO-free glass, and float glass, but also colored glass, specialty glass (such as those containing ingredients to control solar heating), coated glass (such as those sputtered with metals (e.g., silver or indium tin oxide) for solar control purposes), low E-glass, Toroglas® glass (Saint-Gobain N.A. Inc., Trumbauersville, Pa.), Solexia™ glass (PPG Industries, Pittsburgh, Pa.) and Starphire® glass (PPG Industries). Such specialty glasses are disclosed in, e.g., U.S. Pat. Nos. 4,615,989; 5,173,212; 5,264,286; 6,150,028; 6,340, 646; 6,461,736; and 6,468,934. It is understood, however, that the type of glass to be selected for a particular module depends on the intended use.

Suitable film layers comprise polymers that include but are not limited to, polyesters (e.g., poly(ethylene terephthalate) and poly(ethylene naphthalate)), polycarbonate, polyolefins (e.g., polypropylene, polyethylene, and cyclic polyolefins), norbornene polymers, polystyrene (e.g., syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophane, silicones, poly(vinyl chlorides) (e.g., poly(vinylidene chloride)), fluoropolymers (e.g., polyvinyl fluoride, polyvinylidene fluoride, polytetrafluoroethylene, ethylene-tetrafluoroethylene copolymers, etc.), and combinations of two or more thereof. The polymeric film may be non-oriented, or uniaxially oriented, or biaxially oriented. Some specific exemplary films that may be used in the solar cell module outer layers (e.g., the incident layer or the backing layer) include, but are not limited to, polyester films (e.g., poly(ethylene terephthalate) films), fluoropolymer films (e.g., Tedlar®, Tefzel®, and Teflon® films available from E.I. du Pont de Nemours and Company (DuPont), Wilmington, Del.). Metal films, such as aluminum foil, may also be used as the backing layers. Further, the films used in the solar cell module outer layers may be in the form of multi-layer films, such as a fluoropolymer/polyester/fluoropolymer multilayer film (e.g., the Tedlar® film/PET film/Tedlar® film laminate composite (TPT)).

The solar cell module may further comprise other functional film or sheet layers (e.g., dielectric layers or barrier layers) embedded within the module. Such functional layers may be derived from any of the above mentioned polymeric films or those that are coated with additional functional coatings. For example, poly(ethylene terephthalate) films coated with a metal oxide coating, such as those disclosed in U.S. Pat. Nos. 6,521,825 and 6,818,819 and European Patent No. EP1182710, may function as oxygen and moisture barrier layers in the laminates.

If desired, a layer of nonwoven glass fiber (scrim) may also be included between the solar cell layers and the encapsulants to facilitate deaeration during the lamination process or to serve as reinforcement for the encapsulants. The use of such scrim layers is disclosed in, e.g., U.S. Pat. Nos. 5,583,057; 6,075,202; 6,204,443; 6,320,115; and 6,323,416 and European Patent No. EP0769818.

A special film or sheet may be included to serve both the function of an encapsulant layer and an outer layer. It is also conceivable that any of the film or sheet layers included in the module may be in the form of a pre-formed single-layer or multilayer film or sheet.

If desired, one or both surfaces of the incident layer films and sheets, the backing layer films and sheets, the encapsulant layers and other layers incorporated within the solar cell module may undergo any suitable adhesion enhancing treatment. This adhesion enhancing treatment may take any form known within the art and includes flame treatments (see, e.g., U.S. Pat. Nos. 2,632,921; 2,648,097; 2,683,894; and 2,704,382), plasma treatments (see e.g., U.S. Pat. No. 4,732,814), electron beam treatments, oxidation treatments, corona discharge treatments, chemical treatments, chromic acid treatments, hot air treatments, ozone treatments, ultraviolet light treatments, sand blast treatments, solvent treatments, and combinations of two or more thereof. Also, the adhesion strength may be further improved by further applying an adhesive or primer coating on the surface of the laminate layer(s). For example, U.S. Pat. No. 4,865,711 discloses a film or sheet with improved bondability, which has a thin layer of carbon deposited on one or both surfaces. Other exemplary adhesives or primers may include silanes, poly (allyl amine) based primers (see e.g., U.S. Pat. Nos. 5,411,845; 5,770,312; 5,690,994; and 5,698,329), and acrylic based primers (see e.g., U.S. Pat. No. 5,415,942). The adhesive or primer coating may take the form of a monolayer of the adhesive or primer and have a thickness of about 0.0004 to about 1 mil (about 0.00001 to about 0.03 mm), or preferably, about 0.004 to about 0.5 mil (about 0.0001 to about 0.013 mm), or more preferably, about 0.004 to about 0.1 mil (about 0.0001 to about 0.003 mm).

Figure 1:
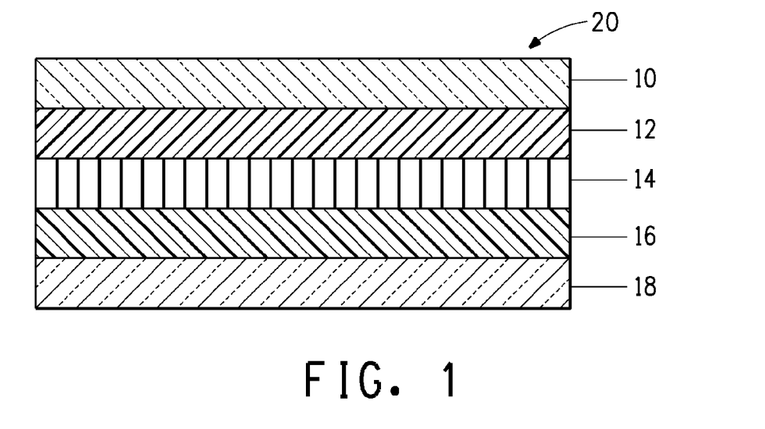
FIG. 1 is a cross-sectional view, not-to-scale, of a wafer-based solar cell module disclosed herein.

In one particular embodiment of the invention (now referring to FIG. 1), where the solar cells are derived from wafer-based self supporting solar cell units, the solar cell module (20) may comprise, in order of position from the front sun-facing side to the back non-sun-facing side, (a) an incident layer (10), (b) a front encapsulant layer (12), (c) a solar cell layer (14) comprised of one or more electrically interconnected solar cells, (d) a back encapsulant layer (16), and (e) a backing layer (18), wherein at least one or both of the front and back encapsulant layers (12 and 16) is formed of the sheet comprising the ionomer composition.

Figure 2:
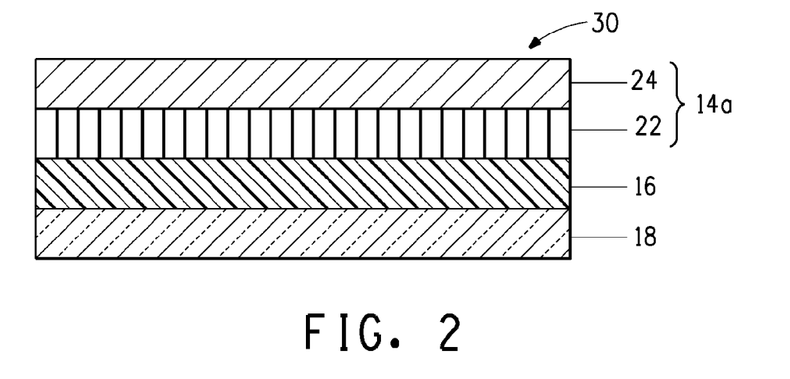
FIG. 2 is a cross-sectional view, not-to-scale, of one particular thin film solar cell module disclosed herein.
Figure 3:
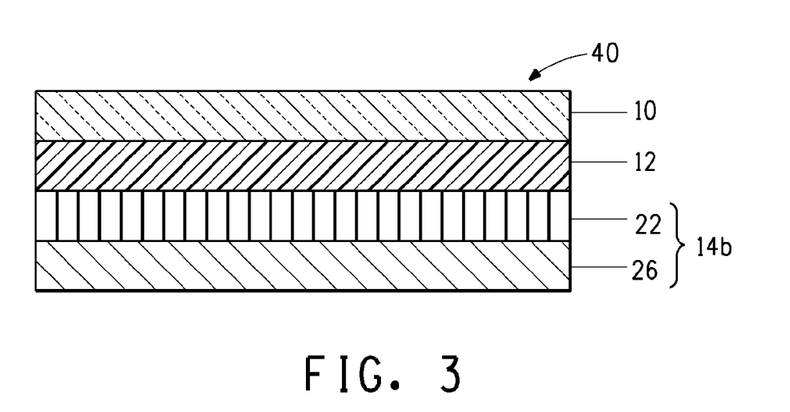
FIG. 3 is a cross-sectional view, not-to-scale, of another thin film solar cell module disclosed herein.

In a further embodiment, the solar cell modules are derived from thin film solar cells and may (i) in one embodiment (30 in FIG. 2), comprise, in order of position from the front sun-facing side to the back non-sun-facing side, (a) a solar cell layer (14a) comprising a superstrate (24) and a layer of thin film solar cell(s) (22) deposited thereon at the non-sun-facing side, (b) a (back) encapsulant layer (16) formed of the sheet comprising the ionomer composition, and (c) a backing layer (18) or (ii) in a more preferred embodiment (40 in FIG. 3), comprise, (a) a transparent incident layer (10), (b) a (front) encapsulant layer (12) formed of the sheet comprising the ionomer composition, and (c) a solar cell layer (14b) comprising a layer of thin film solar cell(s) (22) deposited on a substrate (26) at the sun-facing side thereof.

Moreover, a series of the solar cell modules described above may be further linked to form a solar cell array, which can produce a desired voltage and current.

Any lamination process known within the art (such as an autoclave or a non-autoclave process) may be used to prepare the solar cell modules.

In an exemplary process, the component layers of the solar cell module are stacked in the desired order to form a pre-lamination assembly. The assembly is then placed into a bag capable of sustaining a vacuum ("a vacuum bag"), the air is drawn out of the bag by a vacuum line or other means, the bag is sealed while the vacuum is maintained (e.g., at least about 27-28 in Hg (689-711 mm Hg)), and the sealed bag is placed in an autoclave and the pressure is raised to about 150 to about 250 psi (about 11.3 to about 18.8 bar), a temperature of about 130° C. to about 180° C., or about 130° C. to about 160° C., or about 135° C. to about 155° C., or about 145° C. to about 155° C., for about 10 to about 50 min, or about 20 to about 45 min, or about 20 to about 40 min, or about 25 to about 35 min. A vacuum ring may be substituted for the vacuum bag. One type of suitable vacuum bag is disclosed within U.S. Pat. No. 3,311,517. Following the heat and pressure cycle, the air in the autoclave is cooled without adding additional gas to maintain pressure in the autoclave. After about 20 min of cooling, the excess air pressure is vented and the laminates are removed from the autoclave.

Alternatively, the pre-lamination assembly may be heated in an oven at about 80° C. to about 120° C., or about 90° C. to about 100° C., for about 20 to about 40 min, and thereafter, the heated assembly is passed through a set of nip rolls so that the air in the void spaces between the individual layers may be squeezed out, and the edge of the assembly sealed. The assembly at this stage is referred to as a pre-press.

The pre-press may then be placed in an air autoclave where the temperature is raised to about 120° C. to about 160° C., or about 135° C. to about 160° C., at a pressure of about 100 to about 300 psi (about 6.9 to about 20.7 bar), or preferably about 200 psi (13.8 bar). These conditions are maintained for about 15 to about 60 min, or about 20 to about 50 min, after which the air is cooled while no further air is introduced to the autoclave. After about 20 to about 40 min of cooling, the excess air pressure is vented and the laminated products are removed from the autoclave.

The solar cell modules may also be produced through non-autoclave processes. Such non-autoclave processes are disclosed, e.g., in U.S. Pat. Nos. 3,234,062; 3,852,136; 4,341,576; 4,385,951; 4,398,979; 5,536,347; 5,853,516; 6,342,116; and 5,415,909, U.S. Patent Publication No. 2004/0182493, European Patent No. EP1235683 B1, and PCT Patent Publication Nos. WO9101880 and WO03057478. Generally, the non-autoclave processes include heating the pre-lamination assembly and the application of vacuum, pressure or both. For example, the assembly may be successively passed through heating ovens and nip rolls.

These examples of lamination processes are not intended to be limiting. Essentially any lamination process may be used.

If desired, the edges of the solar cell module may be sealed to reduce moisture and air intrusion that lead to potential reduction of the efficiency and lifetime of the solar cell(s). The edges may be sealed by any means disclosed within the art. Suitable edge seal materials include, but are not limited to, butyl rubber, polysulfide, silicone, polyurethane, polypropylene elastomers, polystyrene elastomers, polyolefin block copolymer elastomers, styrene-ethylene-butylene-styrene (SEBS), and the like.

The invention is further illustrated by the following examples of certain embodiments.

EXAMPLES

The following Examples are intended to be illustrative of the invention, and are not intended in any way to limit the scope of the invention.

Examples E1-E3 and Comparative Examples CE1-CE16

The ionomers used in each of the following examples were prepared as follows. First, the precursor acid copolymers (i.e., the copolymers of ethylene and methacrylic acid) of the ionomers were produced by free radical polymerization in an adiabatic continuous stirred autoclave, substantially according to the procedure described in Example 1 of U.S. Pat. No. 5,028,674 with the following exceptions: (1) by controlling the ratio of ethylene to methacrylic acid and the flow rate of the initiator, the reactor conditions were maintained at a temperature of about 200° C. to about 260° C. and at a pressure of between 170 and 240 MPa; (2) no propane telogen was fed in the reactor (except in CE13); (3) the total concentration of methanol in the reactor was maintained at about 2 to 5 mol %, based on the total feed of ethylene, methacrylic acid, methanol and initiator solution (or based on the total feed of propane telogen, ethylene, methacrylic acid, methanol, and initiator solution in CE13); and (4) the system was maintained at a steady state with the residence time of the material flowing through the reactor being about 5 seconds to 2 minutes. In addition, depending on the particular acid copolymer to be synthesized, one of two different free-radical initiators were used, tert-butyl peracetate or tert-butyl peroctoate. When tert-butyl peracetate was the initiator (as in E1, E2, E3, CE1, CE2, CE3, CE13, and CE15), it was utilized as a solution in odorless mineral spirits at 50% concentration. When tert-butyl peroctoate was the initiator (as in CE4, CE5, CE6, CE7, CE8, CE9, CE10, CE11, CE12, CE14, and CE16), it was utilized as a mixture at 90% concentration in odorless mineral spirits. Then the ionomers were obtained by partially neutralizing the precursor copolymers of ethylene and methacrylic acid with sodium hydroxide solution either in a single screw extruder under high shear melt mixing conditions with the melt temperature set at 200° C. to 270° C., or using the general method described in Example 1 of U.S. Pat. No. 6,518,365.

The ionomers thus obtained then underwent differential scanning calorimetry (DSC) testing in accordance with ASTM D3418 with a temperature profile of (a) heating to 180° C.; (b) holding for 3 minutes; (c) cooling to 25° C. at a rate of 10° C./min; (d) holding for 3 minutes; and (e) heating to 180° C. at a rate of 10° C./min. The freeze enthalpies for the ionomers were determined and are reported in Table 2. The results demonstrate that a freeze enthalpy for each of the ionomers disclosed herein (E1-E3) was not detectable, while each of the prior art ionomers (CE1-CE16) has a freeze enthalpy greater than 3 j/g.

Further, the ionomers were fed into 25 mm diameter Killion extruders under the temperature profile set in Table 1 and extrusion cast into polymer sheets. Specifically, the polymer throughput was controlled by adjusting the screw speed to maximum throughput. A 150 mm slot die with a nominal gap of 2 mm was fed by the extruder. The cast sheet was fed onto a 200 mm diameter polished chrome chill roll held at a temperature of between 10° C. and 15° C. and rotating at 1 to 2 rpm. The nominally 0.76 mm (30 mil) thick sheets were then removed and cut into 300×300 mm squares.

The ionomer sheets were used as interlayer sheets to form glass laminates. Specifically, annealed glass sheets (100×100×3 mm) were washed with a solution of trisodium phosphate (5 g/l) in de-ionized water at 50° C. for 5 min, then rinsed thoroughly with de-ionized water and dried. Six layers of each respective ionomer sheet (about 0.76 mm thick each) were stacked together and placed between the two lites of glass sheet (to yield an interlayer thickness of 180 mils (4.57 mm)). The moisture level of the ionomer sheets was kept below 0.06% by weight by minimizing contact time to the room environment (~35% RH). The pre-lamination assembly was then taped together with a piece of polyester tape in several locations to maintain relative positioning of each layer with the glass lites. A nylon fabric strip was placed around the periphery of the assembly to facilitate air removal from within the layers. The assembly was placed inside a nylon vacuum bag, sealed and then a connection was made to a vacuum pump. Vacuum was applied to allow substantial removal of air from within the bagged assembly (air pressure inside the bag was reduced to below 50 millibar absolute). The bagged assembly was then heated in a convection air oven to 120° C. and maintained at these conditions for 30 min. A cooling fan was then used to cool the assembly to near ambient temperature, after which the vacuum source was disconnected and the bag was removed, yielding a fully pre-pressed assembly of glass and interlayer. Although hermetically sealed around the periphery, several areas of the assembly were not fully bonded as indicated by the presence of bubbles in these areas. The assembly was then placed into an air autoclave and the temperature and pressure were increased from ambient to 135° C. at 13.8 bar over 15 min. The assembly was maintained at such condition for 30 min after which the resulting laminate was rapidly cooled (i.e., at Cooling Rate A of 2.5° C./min) to room temperature at ambient pressure. The thus obtained laminate was then tested for haze in accordance with ASTM D1003 using a Haze-gard Plus hazemeter (BYK-Gardner, Columbia, Md.). Thereafter, the same laminate was heated to 120° C. in an oven and maintained at that temperature for 2 to 3 hours before it was slowly cooled (i.e., Cooling Rate B of 0.1° C./min) to room temperature and then tested for haze.

As shown by the comparative examples (CE1-CE16), the haze levels of glass laminates comprising prior art ionomer interlayer sheets are dependent on the cooling rate under which the laminates were obtained. In general, a slower cooling rate would increase the laminate haze and therefore decrease the optical property thereof. However, as illustrated by the data shown in Table 2, not only do glass laminates comprising interlayer sheets made from ionomers disclosed herein (E1-E3) tend to exhibit lower haze than glass laminates comprising prior art ionomer interlayer sheets (CE1-CE16), the haze levels of the glass laminates made from ionomers disclosed herein were not affected by the cooling rate under which the laminates were obtained.

TABLE 1

| Extruder Zone | Temperature (° C.) |
| --- | --- |
| Feed | Ambient |
| Zone 1 | 100-170 |
| Zone 2 | 150-210 |
| Zone 3 | 170-230 |
| Adapter | 170-230 |
| Die | 170-230 |

Examples E4-23

12×12 in (305×305 mm) solar cell modules described in Table 3 are assembled and laminated by either Lamination Process 1 (Examples E4-13) or Lamination Process 2 (Examples E14-23), as described below. Layers 1 and 2 constitute the incident layer and the front-sheet encapsulant layer, respectively, and Layers 4 and 5 constitute the back-sheet encapsulant layer and the back-sheet, respectively, when applicable.

In Lamination Process 1, the component layers of the laminate are stacked to form a pre-lamination assembly. For the assembly containing a polymeric film layer as the outer surface layer, a cover glass sheet is placed over the film layer. The pre-lamination assembly is then placed within a Meier ICO-LAM® 10/08 laminator (Meier laminator; Meier Vakuumtechnik GmbH, Bocholt, Germany). The lamination cycle includes an evacuation step (vacuum of 3 in Hg (76 mm Hg)) of 5.5 min and a pressing stage (pressure of 1000 mbar) of 5.5 min at a temperature of 145° C. The resulting laminate is then removed from the laminator.

In Lamination Process 2, the pre-lamination assembly is placed in a vacuum bag, which is sealed and a vacuum is applied to remove the air from the vacuum bag. The bag is placed into an oven and heated to a temperature of about 90° C. to about 100° C. for 30 min to remove air contained within the assembly. The assembly is then subjected to autoclaving at 140° C. for 30 min in an air autoclave to a pressure of 200 psig (14.3 bar). The air is cooled without further introduction of air to the autoclave. After 20 min of cooling and when the air temperature reaches less than about 50° C., the autoclave is vented and the vacuum bag containing the laminated assembly is removed from the autoclave. The resulting laminate is then removed from the vacuum bag.

TABLE 2

| Example | Single Phase[1] | MAA (wt %)[2] | MFR (Base Resin)[3] | % Neut. (Sodium)[4] | MFR (Ionomer)[5] | Freeze Enthalpy (j/g) | Laminate Haze Cooling Rate A | Laminate Haze Cooling Rate B |
| --- | --- | --- | --- | --- | --- | --- | --- | --- |
| E1 | Yes | 23 | 270 | 43 | 3.2 | n.d.[6] | 0.7 | 1.1 |
| E2 | Yes | 23 | 270 | 52 | 0.8 | n.d.[6] | 1.2 | 1.4 |
| E3 | Yes | 22 | 350 | 53 | 2.5 | n.d.[6] | 0.6 | 0.6 |
| CE1 | Yes | 23 | 270 | 33 | 8.2 | 3.13 | 0.9 | 9.8 |
| CE2 | Yes | 23 | 270 | 26 | 16.0 | 7.32 | 5.3 | 21.6 |
| CE3 | Yes | 23 | 270 | 14 | 40.0 | 21.97 | 5.1 | 59.1 |
| CE4 | No | 22 | 25 | 38 | 0.4 | 4.38 | 1.2 | 8.6 |
| CE5 | No | 22 | 25 | 30 | 0.9 | 13.36 | 3.4 | 11.9 |
| CE6 | No | 22 | 25 | 25 | 1.5 | 16.31 | 3.8 | 17.2 |
| CE7 | No | 22 | 25 | 20 | 2.3 | 20.95 | 3.2 | 23.5 |
| CE8 | No | 22 | 25 | 15 | 3.4 | 27.15 | 2.5 | 33.5 |
| CE9 | No | 22 | 30 | 32 | 1.2 | 10.18 | 1.9 | 10.8 |
| CE10 | No | 22 | 30 | 32 | 1.2 | 16.09 | 2.6 | 14.4 |
| CE11 | No | 22 | 25 | 26 | 1.8 | 14.22 | 1.8 | 18.7 |
| CE12 | No | 21 | 30 | 29 | 2.0 | 21.67 | 1.5 | 21.2 |
| CE13 | No | 20 | 350 | 49 | 3.2 | 4.4 | 1.1 | 12.5 |
| CE14 | No | 20 | 12 | 23 | 0.5 | 25.47 | 2.6 | 26.7 |
| CE15 | No | 19 | 225 | 45 | 4.5 | 10.81 | 3.1 | 27.5 |
| CE16 | No | 19 | 60 | 37 | 2.6 | 18.20 | 1.5 | 50.8 |

[1]During the polymerization process, a single phase was maintained throughout the reactor;
[2]Weight percent of copolymerized units of methacrylic acid comprised in the precursor acid copolymer, from which the ionomer that forms the laminate interlayer sheet is derived;
[3]The melt flow rate (MFR) of the precursor acid copolymer was calculated based on the MFR of the ionomer;
[4]% neut. Sodium is the percentage of carboxylic acid groups present in the precursor acid copolymer which have been neutralized;
[5]The melt flow rate (MFR) of the ionomer, as determined in accordance with ASTM D1238 at 190° C. and 2.16 kg;
[6]"n.d." means that the freeze enthalpy is not detectable, when measured in accordance with ASTM D3418-03.

TABLE 3

| Sample No. | Layer 1 | Layer 2 | Layer 3 | Layer 4 | Layer 5 |
|---|---|---|---|---|---|
| E4, E14 | Glass 1 | Ionomer 1 | Solar Cell 1 | | |
| E5, E15 | Glass 2 | Ionomer 2 | Solar Cell 2 | | |
| E6, E16 | | | Solar Cell 3 | Ionomer 3 | Glass 2 |
| E7, E17 | Glass 1 | Ionomer 4 | Solar Cell 4 | ACR 1 | FPF |
| E8, E18 | | | Solar Cell 5 | Ionomer 5 | Glass 2 |
| E9, E19 | Glass 1 | Ionomer 6 | Solar Cell 4 | Ionomer 6 | Glass 3 |
| E10, E20 | Glass 1 | Ionomer 7 | Solar Cell 1 | | |
| E11, E21 | | | Solar Cell 5 | Ionomer 1 | Glass 2 |
| E12, E22 | | | Solar Cell 5 | Ionomer 7 | Glass 2 |
| E13, E23 | Glass 1 | Ionomer 7 | Solar Cell 4 | Ionomer 3 | FPF |

ACR 1 is a 20 mil (0.51 mm) thick embossed sheet derived from ethylene methacrylic acid copolymer containing 18 wt % of copolymerized units of methacrylic acid and having a MFR of 2.5 g/10 min (as determined in accordance with ASTM D1238 at 190° C., 2.15 kg).
FPF is a corona surface treated Tedlar ® film (1.5 mil (0.038 mm) thick), a product of E.I. du Pont de Nemours and Co., Inc.
Glass 1 is Starphire ® glass from the PPG Corporation.
Glass 2 is a clear annealed float glass plate layer (2.5 mm thick).
Glass 3 in a Solex ® solar control glass (3.0 mm thick).
Ionomer 1 is a 60 mil (1.50 mm) thick embossed sheet made from the same ionomer used in E1.
Ionomer 2 is a 20 mil (0.51 mm) thick embossed sheet made from the same ionomer used in E1.
Ionomer 3 is a 20 mil (0.51 mm) thick embossed sheet made from the same ionomer used in E2.
Ionomer 4 is a 20 mil (0.51 mm) thick embossed sheet made from the same ionomer used in E3.
Ionomer 5 is a 45 mil (1.14 mm) thick embossed sheet made from the same ionomer used in E2.
Ionomer 6 is a 35 mil (0.89 mm) thick embossed sheet made from the same ionomer used in E2.
Ionomer 7 is a 45 mil (1.14 mm) thick embossed sheet made from the same ionomer used in E3.
Solar Cell 1 is a 10 × 10 in (254 × 254 mm) a-Si based thin film solar cell with a 125 μm thick stainless steel substrate (U.S. Pat. No. 6,093,581, Example 1).
Solar Cell 2 is a 10 × 10 in (254 × 254 mm) CIS based thin film solar cell (U.S. Pat. No. 6,353,042, column 6, line 19).
Solar Cell 3 is a 10 × 10 in (254 × 254 mm) CdTe based thin film solar cell (U.S. Pat. No. 6,353,042, column 6, line 49).
Solar Cell 4 is a silicon solar cell made from a 10 × 10 in (254 × 254 mm) polycrystalline EFG-grown wafer (U.S. Pat. No. 6,660,930, column 7, line 61).
Solar Cell 5 is a thin film solar cell supported on 12 × 12 in (305 × 305 mm) glass sheet (U.S. Pat. Nos. 5,512,107; 5,948,176; 5,994,163; 6,040,521; 6,137,048; and 6,258,620).

Example E24 and Comparative Example CE17

Figure 4:
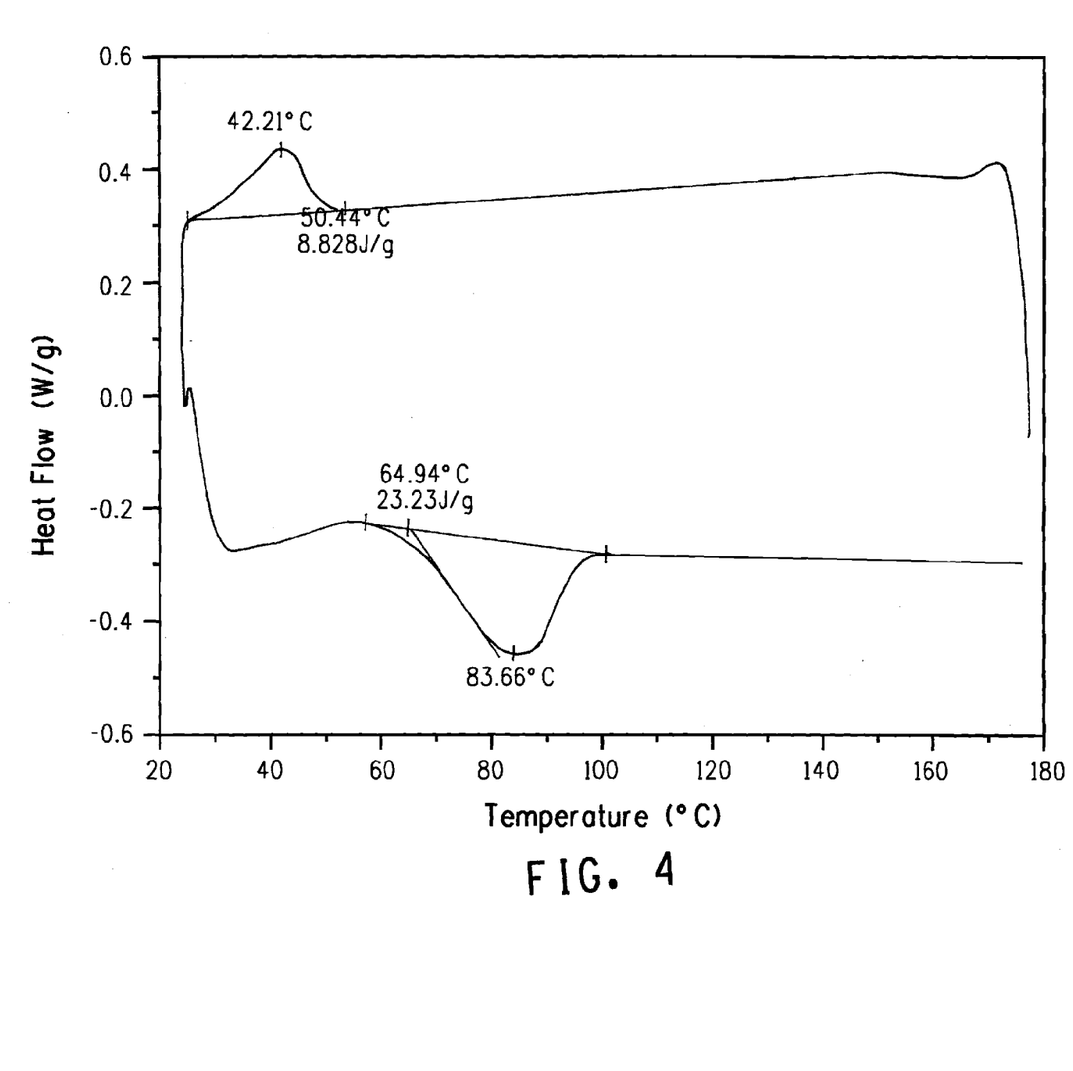
FIG. 4 shows the DSC trace of a prior art ionomer.
Figure 5:
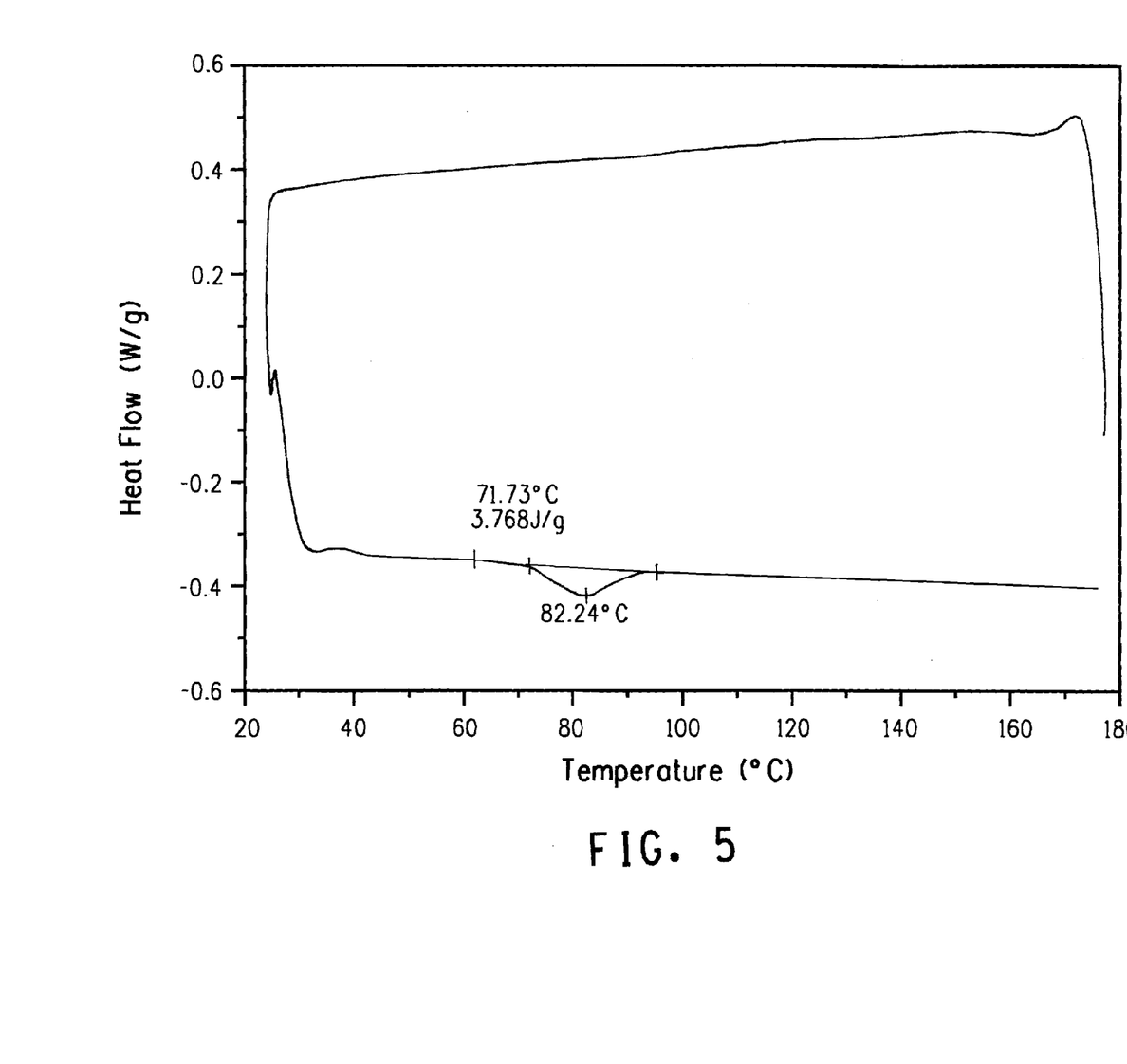
FIG. 5 shows the DSC trace of an ionomer described herein.

The freeze enthalpies of an ionomer suitable for use herein and a prior art ionomer were determined by DSC, according to the methods described above. FIG. 4 shows the results of Comparative Example CE17. Specifically, FIG. 4 is the DSC trace of a prior art ionomer, clearly showing peaks corresponding to heat flow in and out of the ionomer sample. Integration of these peaks provides the enthalpy of the phase transitions in the material. FIG. 5 shows the results of Example E24; specifically, it is the DSC trace of an ionomer suitable for use herein. In contrast, the FIG. 5 shows that the ionomer suitable for use herein has an insignificantly small or undetectable freezing enthalpy.

Examples E25-E27 and Comparative Examples CE18-CE19

In the following examples, two ionomer resins (ION A and ION B) were prepared by the similar process described above. The ionomers or blends thereof were then fed into 25 mm diameter Killion extruders under the temperature profile set in Table 1 and extrusion cast into polymer sheets. The polymer sheets thus obtained were in turn used in forming glass laminates.

Specifically, ION A was a copolymer of ethylene and methacrylic acid containing 21.7 wt % of copolymerized units of methacrylic acid that was 26% neutralized with a sodium ion-containing base and had a MFR of 1.8 g/10 min (as determined in accordance with ASTM D1238 at 190° C. and 2.16 kg). The MFR of the precursor ethylene methacrylic acid copolymer of ION A, prior to neutralization, was 23 g/10 min (190° C. and 2.16 kg). ION B was a copolymer of ethylene and methacrylic acid containing 21.7 wt % of copolymerized units of methacrylic acid that was 53% neutralized with a sodium ion-containing base and had a MFR of 2.5 g/10 min (190° C. and 2.16 kg). The MFR of the precursor ethylene methacrylic acid copolymer of ION B, prior to neutralization, was 350 g/10 min (190° C. and 2.16 kg).

In forming the glass laminates, annealed glass sheets (100× 100×3 mm) were washed with a solution of trisodium phosphate (5 g/l) in de-ionized water at 50° C. for 5 min, then rinsed thoroughly with de-ionized water and dried. Three layers of each respective ionomer sheets (about 0.76 mm thick each) were stacked together and placed between the two glass sheets (to yield an interlayer thickness of 180 mils (2.28 mm)). The moisture level of the ionomer sheets was kept below 0.06% by weight by minimizing contact time to the room environment (~35% RH). The pre-lamination assembly was then taped together with a piece of polyester tape in several locations to maintain relative positioning of each layer with the glass sheets. A nylon fabric strip was placed around the periphery of the assembly to facilitate air removal from within the layers. The assembly was placed inside a nylon vacuum bag, sealed and then a connection was made to a vacuum pump. A vacuum was applied to allow substantial removal of air from within the bagged assembly (air pressure inside the bag was reduced to below 50 millibar absolute). The bagged assembly was then heated in a convection air oven to 120° C. and maintained at these conditions for 30 min. A cooling fan was then used to cool the assembly to near ambient temperature, after which the vacuum source was disconnected and the bag was removed, yielding a fully pre-pressed assembly of glass and interlayer. Although hermetically sealed around the periphery, several areas of the assembly were not fully bonded as indicated by the presence of bubbles in these areas. The assembly was then placed into an air autoclave and the temperature and pressure were increased from ambient to 135° C. at 13.8 bar over 15 min. The assembly was maintained at such condition for 30 min, after which, the resulting laminate was rapidly cooled (i.e., at Cooling Rate A of 2.5° C./min) to room temperature at ambient pressure. The thus obtained laminate was then tested for haze in accordance with ASTM D1003 using a Haze-gard Plus hazemeter (BYK-Gardner, Columbia, Md.). Thereafter, the same laminate was heated to 120° C. in an oven and maintained at such temperature for 2 to 3 hours before it was slowly cooled (i.e., Cooling Rate B of 0.1° C./min) to room temperature and then tested for haze again. The haze results are reported in Table 4 below.

TABLE 4

| | Ionomer Component | | Neutralization | | Haze (%) | |
|---|---|---|---|---|---|---|
| Sample No. | ION A (wt %) | ION B (wt %) | Level (%) | MFR (g/10 min) | Cooling Rate A | Cooling Rate B |
| CE18 | 100 | 0 | 26 | 1.8 | 1.05 | 6.64 |
| E25 | 80 | 20 | 31 | 2.2* | 0.83 | 5.9 |
| E26 | 45 | 55 | 41 | 2.3* | 0.67 | 0.88 |
| E27 | 25 | 75 | 46 | 2.4* | 0.62 | 0.49 |
| CE19 | 0 | 100 | 53 | 2.5 | 0.58 | 0.57 |

*the MFR level for E25-E27 blends were calculated by the ratio of ION A and ION B.

Example E28 and Comparative Example Ce20

In E28 and CE20, a zinc ionomer (ION C, E28) and a sodium ionomer (ION D, CE20) were prepared as described above. In particular, ION C was a copolymer of ethylene and methacrylic acid containing 23 wt % of copolymerized units of methacrylic acid that was 23% neutralized with a zinc ion-containing base and had a MFR of 24 g/10 min (190° C. and 2.16 kg). The MFR of the precursor ethylene methacrylic acid copolymer of ION C, prior to neutralization, was 220 g/10 min (190° C. and 2.16 kg). ION D was a copolymer of ethylene and methacrylic acid containing 19 wt % of copolymerized units of methacrylic acid that was 45% neutralized with a sodium ion-containing base and had a MFR of 4.5 g/10 min (190° C. and 2.16 kg). The MFR of the precursor ethylene methacrylic acid copolymer of ION D, prior to neutralization, was 225 g/10 min (190° C. and 2.16 kg).

The resin pellets as such prepared were then soaked in water at about 25° C. for 7 days. Using Mettler moisture analyzer (Model no.=DL37KF), the moisture absorbing level was determined as 1828 ppm for ION C and 14378 ppm for ION D.

Examples E29-48

12×12 in (305×305 mm) solar cell modules described in Table 5 are assembled and laminated by either Lamination Process 1 (Examples E29-38) or Lamination Process 2 (Examples E39-48), as described above in E4-E23.

TABLE 5

| Sample | Solar Cell Laminate Structure | | | | |
|---|---|---|---|---|---|
| No. | Layer 1 | Layer 2 | Layer 3 | Layer 4 | Layer 5 |
| E29, E39 | Glass 1 | Ionomer 8 | Solar Cell 1 | | |
| E30, E40 | Glass 2 | Ionomer 9 | Solar Cell 2 | | |
| E31, E41 | | | Solar Cell 3 | Ionomer 10 | Glass 2 |
| E32, E42 | Glass 1 | Ionomer 11 | Solar Cell 4 | ACR 1 | FPF |
| E33, E43 | | | Solar Cell 5 | Ionomer 12 | Glass 2 |
| E34, E44 | Glass 1 | Ionomer 13 | Solar Cell 4 | Ionomer 13 | Glass 3 |
| E35, E45 | Glass 1 | Ionomer 14 | Solar Cell 1 | | |
| E36, E46 | | | Solar Cell 5 | Ionomer 8 | Glass 2 |
| E37, E47 | | | Solar Cell 5 | Ionomer 14 | Glass 2 |
| E38, E48 | Glass 1 | Ionomer 14 | Solar Cell 4 | Ionomer 10 | FPF |

ACR 1, FPF, Glass 1-3, and Solar Cell 1-5 are the same as used in E4-E23.
Ionomer 8 is a 60 mil (1.50 mm) thick embossed sheet made from the same ionomer used in E27.
Ionomer 9 is a 20 mil (0.51 mm) thick embossed sheet made from the same ionomer used in E25.
Ionomer 10 is a 20 mil (0.51 mm) thick embossed sheet made from the same ionomer used in E26.
Ionomer 11 is a 20 mil (0.51 mm) thick embossed sheet made from the same ionomer used in E27.
Ionomer 12 is a 45 mil (1.14 mm) thick embossed sheet made from the same ionomer used in E26.
Ionomer 13 is a 35 mil (0.89 mm) thick embossed sheet made from the same ionomer used in E26.
Ionomer 14 is a 45 mil (1.14 mm) thick embossed sheet made from the same ionomer used in E27.

While certain of the preferred embodiments of this invention have been described and specifically exemplified above, it is not intended that the invention be limited to such embodiments. Various modifications may be made without departing from the scope and spirit of the invention, as set forth in the following claims.

What is claimed is:

1. A solar cell module comprising a solar cell layer and an ionomer sheet, wherein:
   (A) the solar cell layer comprises a single solar cell or a plurality of electrically interconnected solar cells; and
   (B) the ionomer sheet comprises an ionomer composition, said ionomer composition comprises a first ionomer that is the neutralized product of a first precursor acid copolymer, wherein (i) the first precursor acid copolymer comprises copolymerized units of ethylene and about 20 to about 30 wt %, based on the total weight of the first precursor acid copolymer, of copolymerized units of a first α,β-ethylenically unsaturated carboxylic acid selected from the group consisting of acrylic acid and methacrylic acid; (ii) the first precursor acid copolymer has a melt flow rate of about 70 to about 1000 g/10 min, as determined in accordance with ASTM D1238 at 190° C. and 2.16 kg; wherein (iii) the first precursor acid copolymer, being neutralized to a level of about 40% to about 90% based on the total number of the carboxylic acid groups present in the first precursor acid copolymer, produces a sodium ionomer, said sodium ionomer comprising carboxylate groups and counterions, and said counterions consisting essentially of sodium cations, and wherein (iv) the sodium ionomer has a melt flow rate of about 0.7 to about 25 g/10 min and a freeze enthalpy that is not detectable or that is less than about 3.0 j/g, as determined by differential scanning calorimetry (DSC) in accordance with ASTM D3418.

2. The solar cell module of claim 1, wherein the first precursor acid copolymer has a melt flow rate of about 100 to about 500 g/10 min.

3. The solar cell module of claim 1, wherein the first precursor acid copolymer comprises about 20 to about 25 wt % of copolymerized units of the first α,β-ethylenically unsaturated carboxylic acid.

4. The solar cell module of claim 1, wherein about 40% to about 70% of the carboxylic acid groups present in the first precursor acid copolymer have been neutralized by a sodium ion-containing base.

5. The solar cell module of claim 1, wherein about 10% to about 60% of of the carboxylic acid groups present in the first precursor acid copolymer has been neutralized by a zinc ion-containing base.

6. The solar cell module of claim 4, wherein the first ionomer has a melt flow rate of about 1 to about 10 g/10 min.

7. The solar cell module of claim 4, wherein the first ionomer has a freeze enthalpy of less than 2 j/g.

8. The solar cell module of claim 1, wherein the ionomer composition further comprises a second ionomer that is the neutralization product of a second precursor acid copolymer, wherein, (i) the second precursor acid copolymer comprises copolymerized units of ethylene and about 18 to about 30 wt %, based on the total weight of the first precursor acid copolymer, of copolymerized units of a second α,β-ethylenically unsaturated carboxylic acid selected from the group consisting of acrylic acid and methacrylic acid; (ii) the second α,β-ethylenically unsaturated carboxylic acid is the same as or different from the first α,β-ethylenically unsaturated carboxylic acid; (iii) the second precursor acid copolymer has a melt flow rate of about 60 g/10 min or less; and (iv) the second ionomer has a melt flow rate of about 10 g/10 min or less, as determined in accordance with ASTM D1238 at 190° C. and 2.16 kg.

9. The solar cell module of claim 8, wherein the first precursor acid copolymer has a melt flow rate of about 150 to about 400 g/10 min and the second precursor acid copolymer has a melt flow rate of about 30 g/10 min or less.

10. The solar cell module of claim 8, wherein the first precursor acid copolymer comprises about 20 to about 25 wt % of copolymerized units of the first α,β-ethylenically unsaturated carboxylic acid, and, independently, the second precursor acid copolymer comprises about 20 to about 25 wt % of copolymerized units of the second α,β-ethylenically unsaturated carboxylic acid.

11. The solar cell module of claim 8, wherein the first ionomer and the second ionomer have been neutralized by a sodium ion-containing base.

12. The solar cell module of claim 8, wherein the first ionomer has a melt flow rate of about 0.7 to about 10 g/10 min and the second ionomer has a melt flow rate of about 5 g/10 min or less.

13. The solar cell module of claim 8, wherein the ionomer composition comprises about 60 to about 95 wt % of the first ionomer and about 5 to about 40 wt % of the second ionomer, based on the total weight of the ionomer composition.

14. The solar cell module of claim 1, wherein the ionomer sheet is in the form of a monolayer sheet and consists essentially of the ionomer composition.

15. The solar cell module of claim 1, wherein the ionomer sheet is in the form of a multilayer sheet and comprises two or more sub-layers, and wherein at least one of the sub-layers consists essentially of the ionomer composition and each of the other sub-layer(s) comprises a polymer selected from the group consisting of acid copolymers, ionomers of acid copolymers, poly(ethylene vinyl acetates), poly(vinyl acetals), polyurethanes, polyvinylchlorides, polyethylenes, polyolefin block copolymer elastomers, copolymers of an α-olefin and an α,β-ethylenically unsaturated carboxylic acid ester, silicone elastomers, epoxy resins, and combinations of two or more thereof.

16. The solar cell module of claim 1, wherein the ionomer sheet has a total thickness of about 1 to about 120 mils (about 0.025 to about 3 mm).

17. The solar cell module of claim 1, wherein the ionomer sheet is directly laminated to the solar cell layer.

18. The solar cell module of claim 1, wherein the solar cell layer has a front sun-facing side and a back non-sun-facing side.

19. The solar cell module of claim 18, which comprises a front encapsulant layer laminated to the sun-facing side of the solar cell layer and a back encapsulant layer laminated to the non-sun-facing side of the solar cell layer, wherein one of the front and back encapsulant layers is the ionomer sheet and the other of the front and back encapsulant layers comprises a polymeric material selected from the group consisting of acid copolymers, ionomers of acid copolymers, poly(ethylene vinyl acetates), poly(vinyl copolymer acetals), polyurethanes, polyvinylchlorides, polyethylenes, polyolefin block elastomers, copolymers of an α-olefin and an α,β-ethylenically unsaturated carboxylic acid ester, silicone elastomers, epoxy resins, and combinations thereof.

20. The solar cell module of claim 19, which comprises two of the ionomer sheets, wherein each of the front and back encapsulant layers is one of the two ionomer sheets.

21. The solar cell module of claim 19, further comprising an incident layer, wherein the incident layer is an outermost surface layer of the module and is positioned on the sun-facing side of the solar cell layer, and wherein the incident layer is selected from the group consisting of (i) glass sheets, (ii) polymeric sheets comprising a polymer selected from the group consisting of polycarbonates, acrylics, polyacrylates, cyclic polyolefins, polystyrenes, polyamides, polyesters, fluoropolymers, and combinations of two or more thereof, and (iii) polymeric films comprising a polymer selected from the group consisting of polyesters, polycarbonate, polyolefins, norbornene polymers, polystyrene, styrene-acrylate copolymers, acrylonitrile-styrene copolymers, polysulfones, nylons, polyurethanes, acrylics, cellulose acetates, cellophane, poly(vinyl chlorides), fluoropolymers, and combinations of two or more thereof.

22. The solar cell module of claim 19, further comprising a backing layer, wherein the backing layer is an outermost surface layer of the module and is positioned on the non-light receiving side of the solar cell layer, and wherein the backing layer is selected from the group consisting of (i) glass sheets, (ii) polymeric sheets, (iii) polymeric films, (iv) metal sheets, and (v) ceramic plates, and wherein the polymeric sheets comprise a polymer selected from the group consisting of polycarbonates, acrylics, polyacrylates, cyclic polyolefins, polystyrenes, polyamides, polyesters, fluoropolymers, and combinations or two or more thereof; and the polymeric films comprise a polymer selected from the group consisting of polyesters, polycarbonates, polyolefins, norbornene polymers, polystyrenes, styrene-acrylate copolymers, acrylonitrile-styrene copolymers, polysulfones, nylons, polyurethanes, acrylics, cellulose acetates, cellophanes, poly(vinyl chlorides), fluoropolymers, and combinations of two or more thereof.

23. The solar cell module of claim 18, wherein the solar cells are wafer-based solar cells selected from the group consisting of crystalline silicon (c-Si) and multi-crystalline silicone (mc-Si) based solar cells.

24. The solar cell module of claim 23, which consists essentially of, in order of position, (i) an incident layer, (ii) a front encapsulant layer laminated to the sun-facing side of the solar cell layer, (iii) the solar cell layer, (iv) a back encapsulant layer laminated to the non-light receiving side of the solar cell layer, and (v) a backing layer, wherein one of the front encapsulant layer or the back encapsulant layer is the ionomer sheet.

25. The solar cell module of claim 18, wherein the solar cells are thin film solar cells selected from the group consisting of amorphous silicon (a-Si), microcrystalline silicon (μc-Si), cadmium telluride (CdTe), copper indium selenide (CIS), copper indium/gallium diselenide (CIGS), light absorbing dyes, and organic semiconductors based solar cells.

26. The solar cell module of claim 25, which consists essentially of, in order of position, (i) an incident layer, (ii) a front encapsulant layer comprising the ionomer sheet, and (iii) the solar cell layer, wherein the solar cell layer further comprises a substrate upon which the thin film solar cells are deposited and the substrate is positioned such that the substrate is an outermost surface of the module and is positioned on the non-sun-facing side of the solar cell layer.

27. The solar cell module of claim 25, which consists essentially of, in order of position, (i) the solar cell layer, (ii) a back encapsulant layer comprising the ionomer sheet, and (iii) a backing layer, wherein the solar cell layer further comprises a superstrate upon which the thin film solar cells are deposited and the superstrate is positioned such that the superstrate is an outermost surface of the module on the sun-facing side of the solar cell layer.

28. A process for preparing a solar cell module of claim 1, comprising: (i) providing an assembly comprising the solar cell layer and the ionomer sheet and (ii) laminating the assembly to form the solar cell module.

29. The process of claim 28, wherein the laminating step is conducted by subjecting the assembly to heat and optionally vacuum or pressure.

* * * * *